United States Patent
Joo et al.

(10) Patent No.: US 12,550,563 B2
(45) Date of Patent: Feb. 10, 2026

(54) DISPLAY DEVICE INCLUDING A DIVIDER

(71) Applicant: SAMSUNG DISPLAY CO., LTD., Yongin-si (KR)

(72) Inventors: Hye Jin Joo, Suwon-si (KR); Jae Min Shin, Suwon-si (KR); Byeong Hee Won, Incheon (KR)

(73) Assignee: Samsung Display Co., Ltd., Yongin-si (KR)

( * ) Notice: Subject to any disclaimer, the term of this patent is extended or adjusted under 35 U.S.C. 154(b) by 111 days.

(21) Appl. No.: 18/482,829

(22) Filed: Oct. 6, 2023

(65) Prior Publication Data

US 2024/0040827 A1 Feb. 1, 2024

Related U.S. Application Data

(63) Continuation of application No. 17/221,727, filed on Apr. 2, 2021, now Pat. No. 11,785,797.

(30) Foreign Application Priority Data

Jul. 10, 2020 (KR) .................. 10-2020-0085224

(51) Int. Cl.
*H10K 59/131* (2023.01)
*H10K 59/121* (2023.01)
*H10K 59/123* (2023.01)
*H10K 59/80* (2023.01)
*H10K 77/10* (2023.01)
*H10K 59/12* (2023.01)

(52) U.S. Cl.
CPC ....... *H10K 59/131* (2023.02); *H10K 59/1213* (2023.02); *H10K 59/123* (2023.02); *H10K 59/873* (2023.02); *H10K 59/8731* (2023.02); *H10K 77/111* (2023.02); *H10K 59/12* (2023.02)

(58) Field of Classification Search
CPC . H10K 59/131; H10K 59/1213; H10K 59/873
USPC .......................................................... 257/40
See application file for complete search history.

(56) References Cited

U.S. PATENT DOCUMENTS

| | | | |
|---|---|---|---|
| 2017/0221976 A1* | 8/2017 | Park | ............ H10K 59/121 |
| 2019/0081127 A1 | 3/2019 | Shim et al. | |
| 2020/0194520 A1* | 6/2020 | Seo | ............ H10K 59/352 |
| 2021/0134861 A1 | 5/2021 | Tanaka et al. | |
| 2021/0384465 A1 | 12/2021 | Park et al. | |

FOREIGN PATENT DOCUMENTS

| | | |
|---|---|---|
| CN | 108766977 A | 11/2018 |
| KR | 2021-0151634 A | 12/2021 |

* cited by examiner

*Primary Examiner* — Xia L Cross
(74) *Attorney, Agent, or Firm* — Womble Bond Dickinson (US) LLP

(57) ABSTRACT

A display device includes: a display panel including a front portion, a first side portion extended from a first side of the front portion, a second side portion extended from a second side of the front portion, and a corner portion between the first side portion and the second side portion. The display panel includes: a first display area on the front portion and including first pixels; and a second display area at the corner portion and including second pixels. The second display area includes a first encapsulation divider between adjacent ones of the second pixels.

20 Claims, 25 Drawing Sheets

DISPLAY DEVICE INCLUDING A DIVIDER

CROSS-REFERENCE TO RELATED APPLICATIONS

This application is a continuation of U.S. patent application Ser. No. 17/221,727, filed Apr. 2, 2021, which claims priority to and the benefit of Korean Patent Application No. 10-2020-0085224, filed Jul. 10, 2020, the entire content of both of which is incorporated herein by reference.

BACKGROUND

1. Field

The present disclosure relates to a display device.

2. Description of the Related Art

As the information-oriented society evolves, various demands for display devices are ever increasing. For example, display devices are being employed by a variety of electronic devices such as smart phones, digital cameras, laptop computers, navigation devices, and smart televisions.

Display devices may be flat panel display devices such as a liquid-crystal display device, a field emission display device, and a light-emitting display device. Light-emitting display devices include an organic light-emitting display device including an organic light-emitting element, an inorganic light-emitting display device including an inorganic light-emitting element such as an inorganic semiconductor, and a micro-light-emitting display device including an ultra-small light-emitting element.

As display devices are employed by various suitable electronic devices, display devices are required to have various suitable designs. For example, when the display device is a light-emitting display device, images may be displayed not only on the front portion but also on the side portions bent at four edges of the front portion, respectively. Such a display device may include a corner portion disposed between a first side portion bent at a first side edge of the front portion and a second side portion bent at a second side edge of the front portion.

SUMMARY

Aspects of some example embodiments of the present disclosure are directed toward a display device that can prevent, or reduce the occurrence of, pixels disposed at a corner portion of the display device from being seen as dark spots as moisture permeates due to particles.

However, aspects of example embodiments of the present disclosure are not limited to those set forth herein. The above and other aspects of example embodiments of the present disclosure will become more apparent to one of ordinary skill in the art to which the present disclosure pertains by referencing the detailed description of the present disclosure given below.

According to some example embodiments of the present disclosure, there is provided a display device including: a display panel including a front portion, a first side portion extended from a first side of the front portion, a second side portion extended from a second side of the front portion, and a corner portion between the first side portion and the second side portion. The display panel includes: a first display area on the front portion and including a plurality of first pixels; and a second display area at the corner portion and including a plurality of second pixels. The second display area includes a first encapsulation divider between adjacent ones of the second pixels.

According to some example embodiments of the present disclosure, there is provided a display device including: a display panel including a front portion, a first side portion extended from a first side of the front portion, a second side portion extended from a second side of the front portion, and a corner portion between the first side portion and the second side portion. The corner portion includes cutout patterns separated by cutting grooves. Each of the cutout patterns includes a display area having a plurality of pixels to display an image. Each of the pixels includes a plurality of emission areas to emit different lights. Each of the emission areas includes a plurality of sub-emission areas to emit light of the same color.

According to the aforementioned and other example embodiments of the present disclosure, because each of the pixels in cutout patterns is surrounded by an encapsulation divider and a dam, they can be encapsulated individually. Accordingly, even if one of the pixels of a cutout pattern is displayed as a dark spot as moisture permeates due to particles, it is possible to prevent, or reduce the occurrence of, the other pixels of the cutout pattern from being damaged and accordingly displayed as dark spots.

According to the aforementioned and other example embodiments of the present disclosure, because each of the emission areas of the pixels in cutout patterns is surrounded by an encapsulation divider and a dam, they can be encapsulated individually. Accordingly, even if one of the emission areas of a pixel of a cutout pattern is displayed as a dark spot as moisture permeates due to particles, it is possible to prevent, or reduce the occurrence of, the other emission areas of the pixel of the cutout pattern from being damaged and accordingly displayed as dark spots.

According to the aforementioned and other example embodiments of the present disclosure, each of the emission areas of the pixels in cutout patterns includes sub-emission areas to emit light of the same color, and each of the sub-emission areas is surrounded and can be encapsulated individually. Therefore, even if some of the sub-emission areas of a cutout pattern are displayed as dark spots as moisture permeates due to particles, it is possible to prevent, or reduce the occurrence of, the other sub-emission areas of the cutout pattern from being damaged and accordingly displayed as dark spots. Therefore, even if some of the sub-emission areas of a pixel are displayed as dark spots as moisture permeates due to particles, it is possible to normally display images by the other sub-emission areas of the pixel.

BRIEF DESCRIPTION OF THE DRAWINGS

The above and other example embodiments and features of the present disclosure will become more apparent by describing example embodiments thereof with reference to the attached drawings, in which.

DETAILED DESCRIPTION

Figure 1:
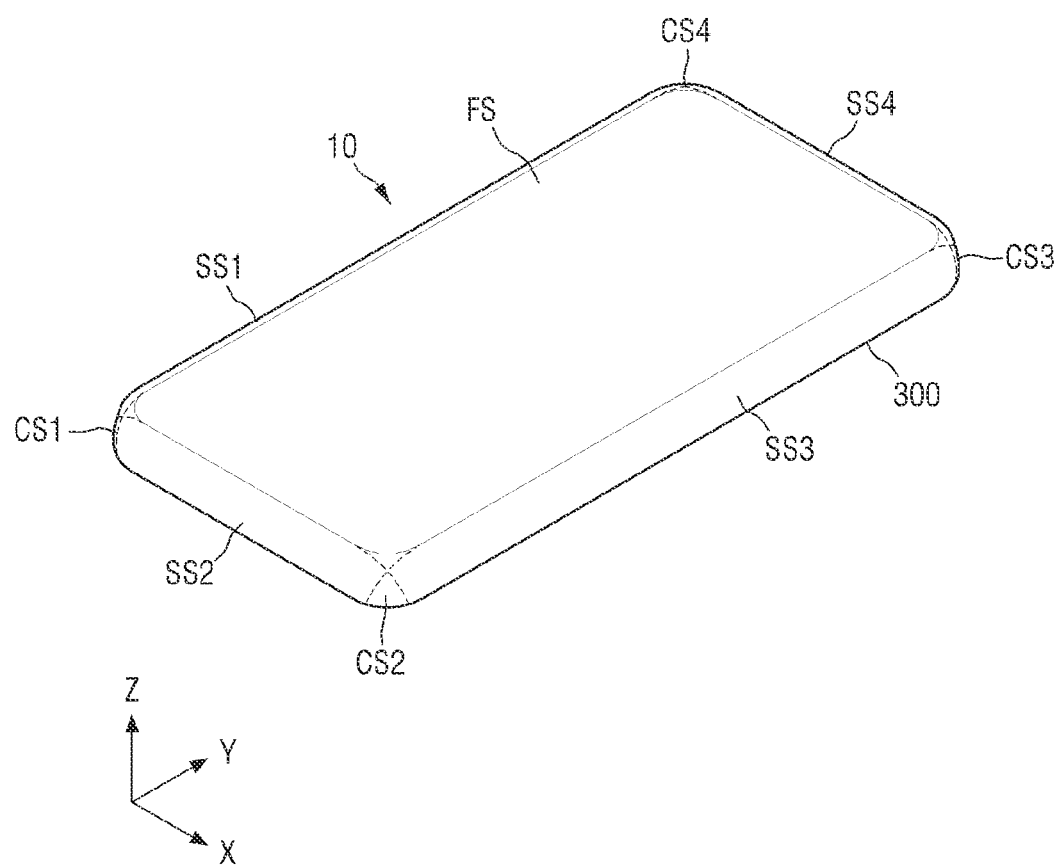
FIG. 1 is a perspective view of a display device according to an example embodiment of the present disclosure.

The present disclosure will now be described more fully hereinafter with reference to the accompanying drawings, in which some embodiments of the disclosure are shown. This disclosure may, however, be embodied in different suitable forms and should not be construed as being limited to the embodiments set forth herein. Rather, these embodiments are provided so that this disclosure will be thorough and complete, and will fully convey the scope of the disclosure to those of ordinary skill in the art. The same reference numbers indicate the same components throughout the specification. In the attached figures, the thickness of layers and regions may be exaggerated for clarity.

Herein, the use of the term "may," when describing embodiments of the present disclosure, refers to "one or more embodiments of the present disclosure." As used herein, the term "and/or" includes any and all combinations of one or more of the associated listed items. As used herein, the singular forms "a," "an," and "the" are intended to include the plural forms as well, unless the context clearly indicates otherwise. As used herein, expressions such as "at least one of," "one of," and "selected from," when preceding a list of elements, modify the entire list of elements and do not modify the individual elements of the list.

It will be understood that when an element or layer is referred to as being "on," "connected to," "coupled to," or "adjacent to" another element or layer, it can be directly on, connected to, coupled to, or adjacent to the other element or layer, or one or more intervening elements or layers may be present. In contrast, when an element or layer is referred to as being "directly on," "directly connected to," "directly coupled to," or "immediately adjacent to" another element or layer, there are no intervening elements or layers present. As used herein, the terms "substantially," "about," and similar terms are used as terms of approximation and not as terms of degree, and are intended to account for the inherent deviations in measured or calculated values that would be recognized by those of ordinary skill in the art.

As used herein, phrases such as "a plan view" may refer to a view from top or from a direction normal to a display area of a display device.

Spatially relative terms, such as "beneath," "below," "lower," "above," "upper," "bottom," "top," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (e.g., rotated 90 degrees or at other orientations), and the spatially relative descriptors used herein should be interpreted accordingly.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present disclosure, and should not be interpreted in an idealized or overly formal sense, unless expressly so defined herein.

Hereinafter, example embodiments of the present disclosure will be described in more detail with reference to the accompanying drawings.

Figure 2:
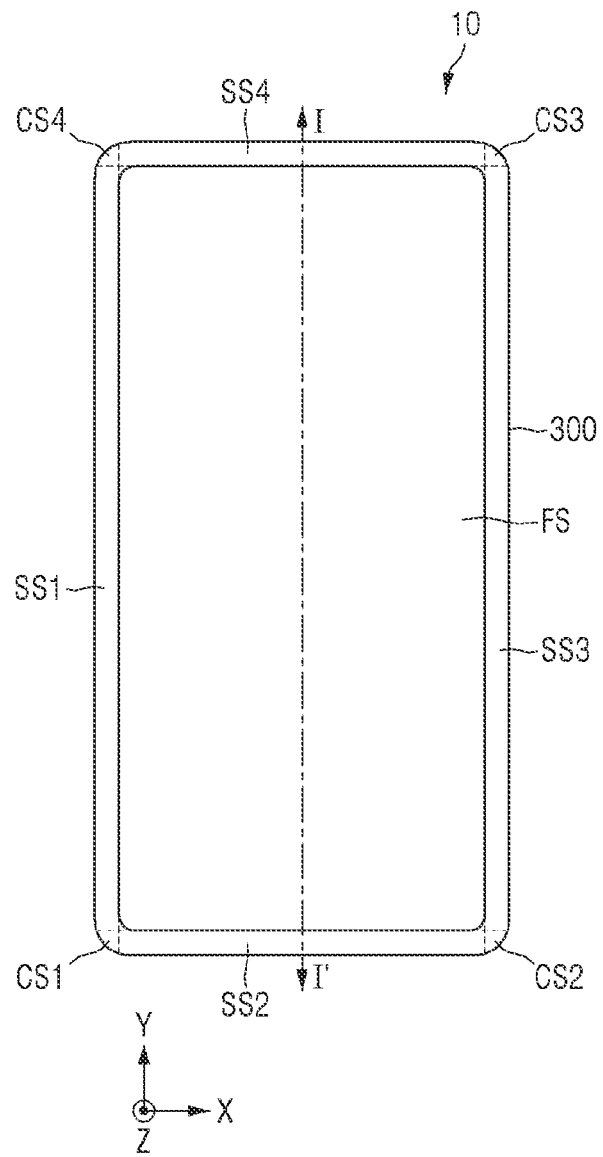
FIG. 2 is a plan view showing a display device according to an example embodiment of the present disclosure.

FIG. 1 is a perspective view of a display device according to an example embodiment of the present disclosure. FIG. 2 is a plan view showing a display device according to an example embodiment of the present disclosure.

Referring to FIGS. 1 and 2, a display device 10 according to an example embodiment of the present disclosure may be employed by portable electronic devices such as, for example, a mobile phone, a smart phone, a tablet PC, a mobile communications terminal, an electronic notebook, an electronic book, a portable multimedia player (PMP), a navigation device and a ultra mobile PC (UMPC). In some embodiments, the display device 10 may be utilized (e.g., used) as, for example, a display unit of a television, a laptop computer, a monitor, an electronic billboard, or the Internet of Things (IOT). In some embodiments, the display device 10 may be applied to wearable devices such as, for example, a smart watch, a watch phone, a glasses-type display (e.g., a display incorporated into, or integrated with, glasses), and a head-mounted display (HMD) device. In some embodiments, the display device 10 may be utilized (e.g., used) as, for example, a center information display (CID) disposed, for example, at an instrument cluster, a center fascia or a dashboard of a vehicle, as a room mirror display on the behalf of the side mirrors of a vehicle, as a display placed on the back of each of front seats that is an entertainment system for passengers at rear seats of a vehicle.

As used herein, the first direction (X-axis direction) may be parallel (e.g., substantially parallel) to shorter sides of the display device 10, for example, the horizontal direction of the display device 10 when viewed from the top (e.g., from a plan view). The second direction (Y-axis direction) may be parallel (e.g., substantially parallel) to longer sides of the display device 10, for example, the vertical direction of the display device 10 when viewed from the top. The third direction (Z-axis direction) may refer to the thickness direction of the display device 10.

The display device 10 according to an example embodiment may include a display panel 300. As shown in FIGS. 1 and 2, the display panel 300 may include a front portion FS, a first side portion SS1, a second side portion SS2, a third side portion SS3, a fourth side portion SS4, a first corner portion CS1, a second corner portion CS2, a third corner portion CS3, and a fourth corner portion CS4.

The display panel 300 may include a suitably flexible substrate that can be bent, folded, and/or rolled. For example, the substrate SUB may include (e.g., be made of) polyethersulphone (PES), polyacrylate (PA), polyetherimide (PEI), polyethylene naphthalate (PEN), polyethylene terephthalate (PET), polyphenylene sulfide (PPS), polyallylate or polyarylate (PAR), polyimide (PI), polycarbonate (PC), cellulose triacetate (CAT), cellulose acetate propionate (CAP), or a combination thereof. In some embodiments, the substrate SUB may include (e.g., be) a metallic material. In addition, only a part of the substrate SUB may be flexible, or the entire area of the substrate SUB may be flexible.

The front portion FS may have, but is not limited to, a rectangular shape having shorter sides in the first direction (X-axis direction) and longer sides in the second direction (Y-axis direction) when viewed from the top. The front portion FS may have other suitable shapes, such as a polygonal shape, a circular shape or an oval shape when viewed from the top. Although the front portion FS is flat in the example shown in FIGS. 1 and 2, the present disclosure is not limited thereto. For example, in some embodiments, the front portion FS may include a curved surface.

The first side portion SS1 may be extended (e.g., may extend) from a first side of the front portion FS. The first side portion SS1 may be bent along (e.g., may be bent or curved along an axis extending along) a first bending line BL1 (see FIG. 3) at (e.g., on) the first side of the front portion FS, and accordingly, may have a first curvature. The first side of the front portion FS may be the left side of the front portion FS as shown in FIGS. 1 and 2.

The second side portion SS2 may be extended (e.g., may extend) from a second side of the front portion FS. The second side portion SS2 may be bent along a second bending line BL2 (see FIG. 3) at (e.g., on) the second side of the front portion FS, and accordingly, may have a second curvature. The second curvature may be different from the first curvature, but the present disclosure is not limited thereto. In some embodiments, the second curvature may be the same as the first curvature. The second side of the front portion FS may be the lower side of the front portion FS as shown in FIGS. 1 and 2.

The third side portion SS3 may be extended (e.g., may extend) from a third side of the front portion FS. The third side portion SS3 may be bent along a third bending line BL3 (see FIG. 3) at (e.g., on) the third side of the front portion FS, and accordingly, may have a third curvature. The third curvature may be equal to the second curvature, but the present disclosure is not limited thereto. In some embodiments, the third curvature may be different from the second curvature. The third side of the front portion FS may be the right side of the front portion FS as shown in FIGS. 1 and 2.

The fourth side portion SS4 may be extended (e.g., may extend) from a fourth side of the front portion FS. The fourth side portion SS4 may be bent along a fourth bending line BL4 (see FIG. 3) at (e.g., on) the fourth side of the front portion FS, and accordingly, may have a fourth curvature. The fourth curvature may be equal to the first curvature, but the present disclosure is not limited thereto. In some embodiments, the fourth curvature may be different from the first curvature. The fourth side of the front portion FS may be the upper side of the front portion FS as shown in FIGS. 1 and 2.

The first corner portion CS1 may be located between the first side portion SS1 and the second side portion SS2. For example, the first corner portion CS1 may be in contact (e.g., direct or physical contact) with a lower side of the first side portion SS1 and a left side of the second side portion SS2. The first corner portion CS1 may have double curvature due to the first curvature of the first side portion SS1 and the second curvature of the second side portion SS2. Accordingly, a strain may be applied to the first corner portion CS1 by a bending force by the first curvature of the first side portion SS1 and by a bending force by the second curvature of the second side portion SS2.

The second corner portion CS2 may be located between the second side portion SS2 and the third side portion SS3. For example, the second corner portion CS2 may be in contact (e.g., direct or physical contact) with a right side of the second side portion SS2 and a lower side of the third side portion SS3. The second corner portion CS2 may have double curvature due to the second curvature of the second side portion SS2 and the third curvature of the third side portion SS3. Accordingly, a strain may be applied to the second corner portion CS2 by a bending force by the second curvature of the second side portion SS2 and by a bending force by the third curvature of the third side portion SS3.

The third corner portion CS3 may be located between the third side portion SS3 and the fourth side portion SS4. For example, the third corner portion CS3 may be in contact (e.g., direct or physical contact) with an upper side of the third side portion SS3 and a right side of the fourth side portion SS4. The third corner portion CS3 may have double curvature due to the third curvature of the third side portion SS3 and the fourth curvature of the fourth side portion SS4. Accordingly, a strain may be applied to the third corner portion CS3 by a bending force by the third curvature of the third side portion SS3 and by a bending force by the fourth curvature of the fourth side portion SS4.

The fourth corner portion CS4 may be located between the first side portion SS1 and the fourth side portion SS4. For example, the fourth corner portion CS4 may be in contact (e.g., direct or physical contact) with an upper side of the first side portion SS1 and a left side of the fourth side portion SS4. The fourth corner portion CS4 may have double curvature due to the first curvature of the first side portion SS1 and the fourth curvature of the fourth side portion SS4. Accordingly, a strain may be applied to the fourth corner portion CS4 by a bending force by the first curvature of the first side portion SS1 and by a bending force by the fourth curvature of the fourth side portion SS4.

Figure 5:
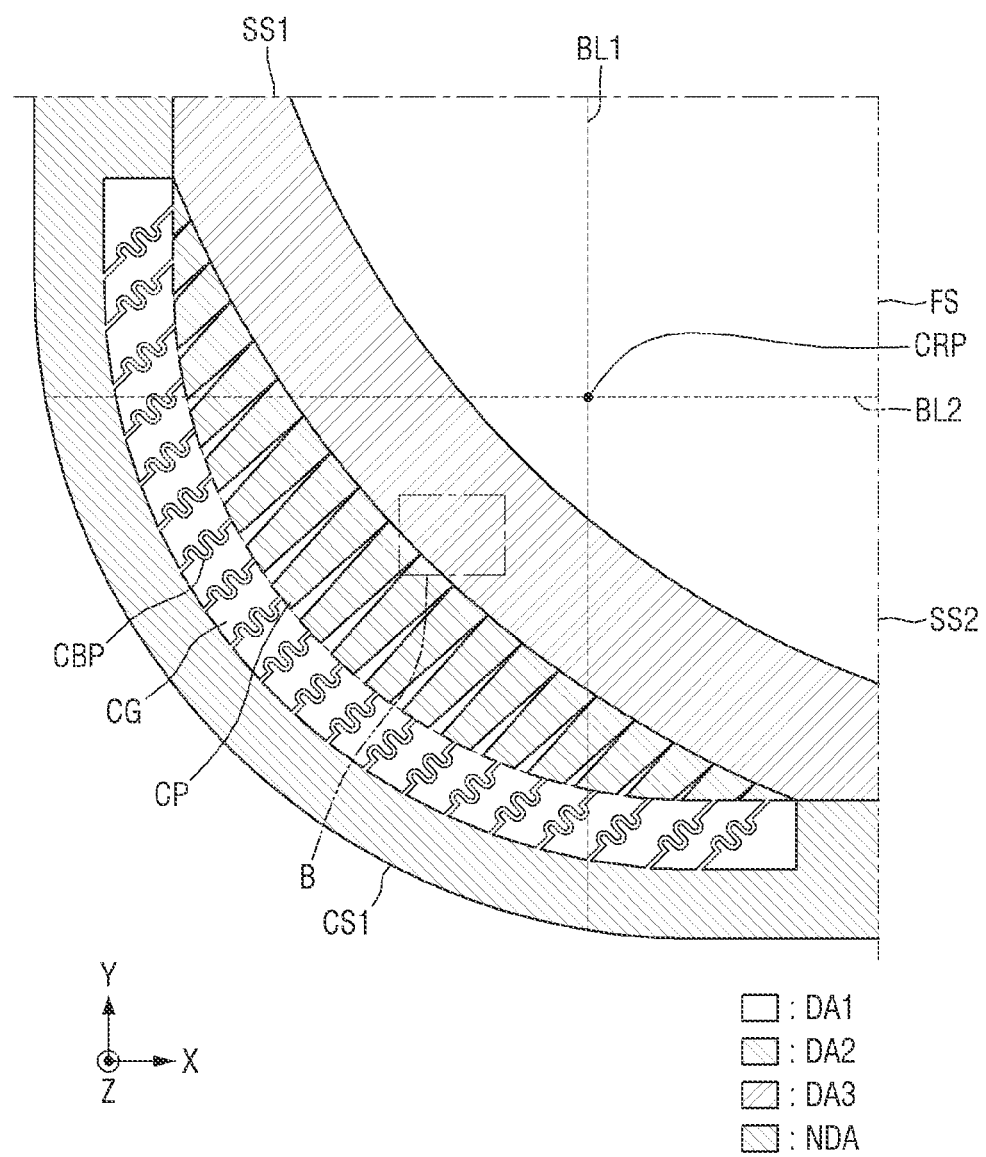
FIG. 5 is a layout diagram showing the first to third display areas and the non-display area of the display panel according to an example embodiment of the present disclosure.

Each of the first corner portion CS1, the second corner portion CS2, the third corner portion CS3 and the fourth corner portion CS4 may include cutout patterns that are separated by cutting grooves in order to reduce the strain due to the double curvature, as shown in FIG. 5. The cutout patterns will be described later with reference to FIG. 5.

Figure 3:
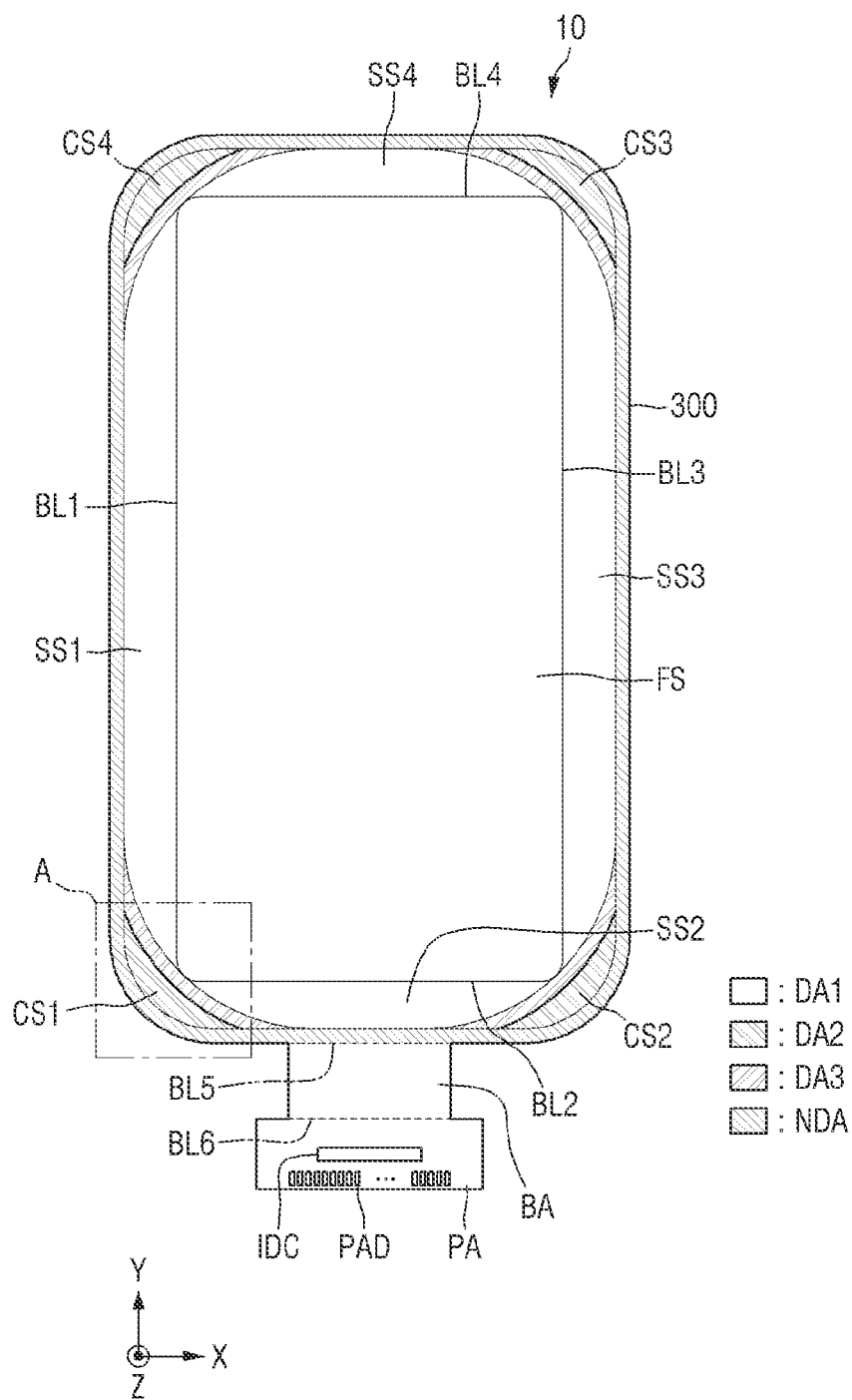
FIG. 3 is a development view showing a display device according to an example embodiment of the present disclosure.

FIG. 3 is a development view showing a display device according to an example embodiment of the present disclosure.

Referring to FIG. 3, the display panel 300 may further include a bending area BA and a pad area PA. The display panel 300 may include first to third display areas DA1 to DA3, a non-display area NDA, the bending area BA, and the pad area PA.

The first to third display areas DA1 to DA3 include pixels or emission areas to display images. The non-display area NDA does not include pixels or emission areas and does not display images. In the non-display area NDA, signal lines or driver circuits embedded in a panel for driving the pixels or the emission areas may be disposed.

The first display area DA1 may be a main display area of the display panel 300 and may include the front portion FS, a part of the first side portion SS1, a part of the second side portion SS2, a part of the third side portion SS3 and a part of the fourth side portion SS4. The part of the first side portion SS1 is extended from the first side of the front portion FS, and the part of the second side portion SS2 is extended from the second side of the front portion FS. The part of the third side portion SS3 is extended from the third side of the front portion FS, and the part of the fourth side portion SS4 is extended from the fourth side of the front portion FS. Each of corner portions of the first display area DA1 may be rounded with a predetermined or set curvature.

Each of the second display areas DA2 may be a second auxiliary display area that assists the first display area DA1, e.g., the main display area. The resolution of each of the second display areas DA2 may be different from the resolution of the first display area DA1. For example, because each of the second display areas DA2 serves to assist the first display area DA1, the resolution of each of the second display areas DA2 may be lower than that of the first display area DA1. For example, the number of third emission areas per unit area in each of the second display areas DA2 may be smaller than the number of first emission areas per unit area in the first display area DA1. It is, however, to be understood that the present disclosure is not limited thereto. The resolution of each of the second display areas DA2 may be substantially equal to the resolution of the first display area DA1.

The second display areas DA2 may be disposed on the outer side of the third display areas DA3, respectively. Accordingly, the third display areas DA3 may be disposed between the first display area DA1 and the second display areas DA2, respectively. At least a part of each of the second display areas DA2 may be disposed at a respective one of the corner portions CS1 to CS4. In addition, at least a part of each of the second display areas DA2 may be disposed at two of the first to fourth side portions SS1 to SS4.

For example, at least a part of the second display area DA2 disposed on the outer side of the corner portion where the lower side and the left side of the first display area DA1 meet may be disposed at the first corner portion CS1, the first side portion SS1 and the second side portion SS2. At least a part of the second display area DA2 disposed on the outer side of the corner portion where the lower side and the right side of the first display area DA1 meet may be disposed at the second corner portion CS2, the second side portion SS2 and the third side portion SS3. At least a part of the second display area DA2 disposed on the outer side of the corner portion where the upper side and the right side of the first display area DA1 meet may be disposed at the third corner portion CS3, the third side portion SS3 and the fourth side portion SS4. At least a part of the second display area DA2 disposed on the outer side of the corner portion where the upper side and the left side of the first display area DA1 meet may be disposed at the fourth corner portion CS4, the first side portion SS1 and the fourth side portion SS4.

Each of the third display areas DA3 may be a second auxiliary display area that assists the first display area DA1, e.g., the main display area. The resolution of each of the third display areas DA3 may be different from the resolution of the first display area DA1. For example, because each of the third display areas DA3 serves to assist the first display area DA1, the resolution of each of the third display areas DA3 may be lower than that of the first display area DA1. For example, the number of second emission areas per unit area in each of the third display areas DA3 may be smaller than the number of first emission areas per unit area in the first display area DA1. It is, however, to be understood that the present disclosure is not limited thereto. The resolution of each of the third display areas DA3 may be substantially equal to the resolution of the first display area DA1.

Each of the third display areas DA3 may be disposed on the outer side of the respective one of the corner portions of the first display area DA1. At least a part of each of the third display areas DA3 may be disposed at the respective one of the corner portions CS1 to CS4. In addition, at least a part of each of the third display areas DA3 may be disposed on the front portion FS. In addition, at least a part of each of the third display areas DA3 may be disposed at two of the first to fourth side portions SS1 to SS4.

For example, at least a part of the third display area DA3 disposed on the outer side of the corner portion where the lower side and the left side of the first display area DA1 meet may be disposed at the front portion FS, the first corner portion CS1, the first side portion SS1 and the second side portion SS2. At least a part of the third display area DA3 disposed on the outer side of the corner portion where the lower side and the right side of the first display area DA1 meet may be disposed at the front portion FS, the second corner portion CS2, the second side portion SS2 and the third side portion SS3. At least a part of the third display area DA3 disposed on the outer side of the corner portion where the upper side and the right side of the first display area DA1 meet may be disposed at the front portion FS, the third corner portion CS3, the third side portion SS3 and the fourth side portion SS4. At least a part of the third display area DA3 disposed on the outer side of the corner portion where the upper side and the left side of the first display area DA1 meet may be disposed at the front portion FS, the fourth corner portion CS4, the first side portion SS1 and the fourth side portion SS4.

The non-display area NDA may include the first side portion SS1, the second side portion SS2, the third side portion SS3, the fourth side portion SS4, the first corner portion CS1, the second corner portion CS2, the third corner portion CS3, and the fourth corner portion CS4. The non-display area NDA may be disposed on the outer sides of the first display area DA1 at the side portions SS1, SS2, SS3 and SS4. For example, the non-display area NDA may be disposed at the left edge of the first side portion SS1, the lower edge of the second side portion SS2, the right edge of the third side portion SS3, and the upper edge of the fourth side portion SS4.

The non-display area NDA may be disposed on the outer sides of the second display areas DA2 at the corner portions CS1, CS2, CS3 and CS4. For example, the non-display area NDA may be disposed at the edge of the corner portion where the lower side and left side of the first corner portion CS1 meet, at the edge of the corner portion where the lower side and the right side of the second corner portion CS2 meet, at the edge of the corner portion where the upper side and the right side of the third corner portion CS3 meet, and at the edge of the corner portion where the upper side and the left side of the fourth corner portion CS4 meet.

The bending area BA may be extended (e.g., may extend) from the lower side of the second side portion SS2. The bending area BA may be disposed between the second side portion SS2 and the pad area PA. The length of the bending area BA in the first direction (X-axis direction) may be smaller than the length of the second side portion SS2 in the first direction (X-axis direction). The bending area BA may be bent along a fifth bending line BL5 on the lower side of the second side portion SS2.

The pad area PA may be extended (e.g., may extend) from the lower side of the bent area BA. The length of the pad area PA in the first direction (X-axis direction) may be larger than the length of the bending area BA in the first direction (X-axis direction). It is, however, to be understood that the present disclosure is not limited thereto. The length of the pad area PA in the first direction (X-axis direction) may be substantially equal to the length of the bending area BA in the first direction (X-axis direction). The pad area PA may be bent along a sixth bending line BL6 on the lower side of the bending area BA. The pad area PA may be disposed on the lower side of the front portion FS.

An integrated driver circuit IDC and the pads PAD may be disposed on the pad area PA. The integrated driver circuit IDC may be implemented as an integrated circuit (IC). The integrated driver circuit IDC may be coupled (e.g., attached) on the pad area PA by a chip on glass (COG) technique, a chip on plastic (COP) technique, or an ultrasonic bonding. In some embodiments, the integrated driver circuit IDC may be disposed on a circuit board disposed on the pads PAD of the pad area PA.

The integrated driver circuit IDC may be electrically coupled (e.g., connected) to the pads PAD of the pad area PA. The integrated driver circuit IDC may receive digital video data and timing signals through the pads PAD of the pad area PA. The integrated driver circuit IDC may convert digital video data into analog data voltages and output them to the data lines of the display areas DA1, DA2, and DA3.

The circuit board may be coupled (e.g., attached) on the pads PAD of the pad area PA utilizing (e.g., using) an anisotropic conductive film. For this reason, the pads PAD of the pad area PA may be electrically coupled (e.g., connected) to the circuit board.

As shown in FIG. 3, the display areas DA1, DA2 and DA3 may be disposed at the front portion FS, the first side portion SS1, the second side portion SS2, the third side portion SS3, the fourth side portion SS4, the first corner portion CS1, the second corner portion CS2, the third corner portion CS3, and the fourth corner portion CS4. Therefore, images can be displayed not only on the front portion (e.g., front side) FS, the first side portion SS1, the second side portion SS2, the third side portion SS3, and the fourth side portion SS4, but also on the first corner portion CS1, the second corner portion CS2, the third corner portion CS3 and the fourth corner portion CS4.

Figure 4:
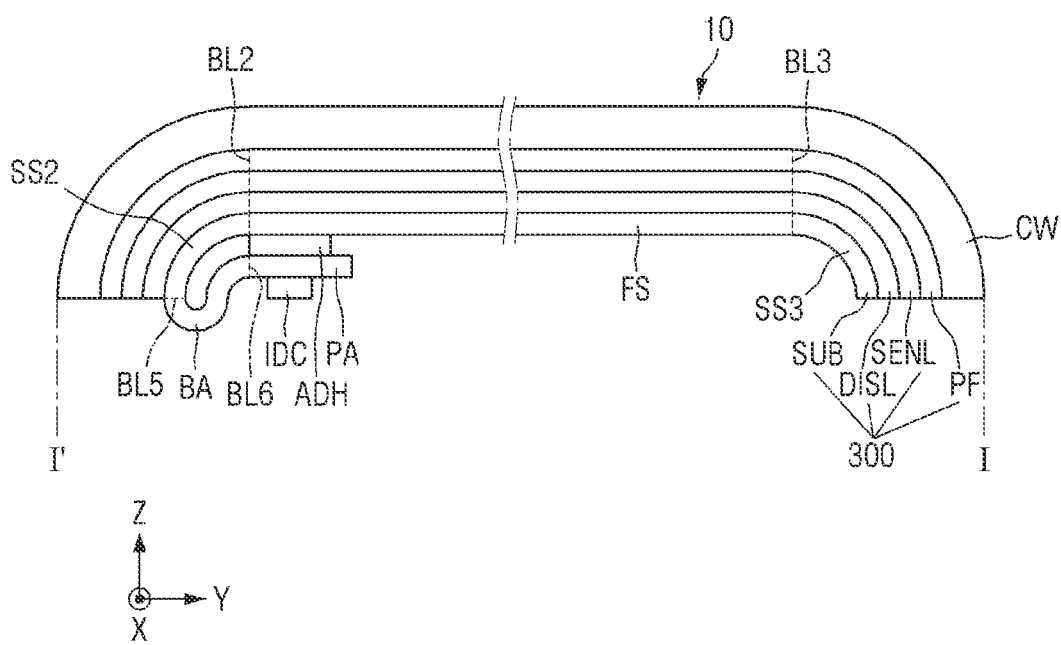
FIG. 4 is a cross-sectional view showing a display device according to an example embodiment of the present disclosure.

FIG. 4 is a cross-sectional view showing a display device according to an example embodiment of the present disclosure. FIG. 4 shows an example of the display device 10, taken along line I-I' of FIG. 2.

Referring to FIG. 4, the display panel 300 may include a substrate SUB, a display layer DISL, a sensor electrode layer SENL, a polarizing film PF, and/or a cover window CW.

The display layer DISL may be disposed on the substrate SUB. The display layer DISL may include the display areas DA1, DA2, and DA3 (see FIG. 3) and the non-display area NDA. In addition to the emission areas, scan lines, data lines, power lines, etc. for driving light-emitting elements may be disposed in the display area DA of the display layer DISL. In the non-display area NDA of the display layer DISL, a scan driver circuit to output scan signals to the scan lines, fan-out lines coupling (e.g., connecting) the data lines with the integrated driver circuit IDC, etc. may be disposed.

Figure 8:
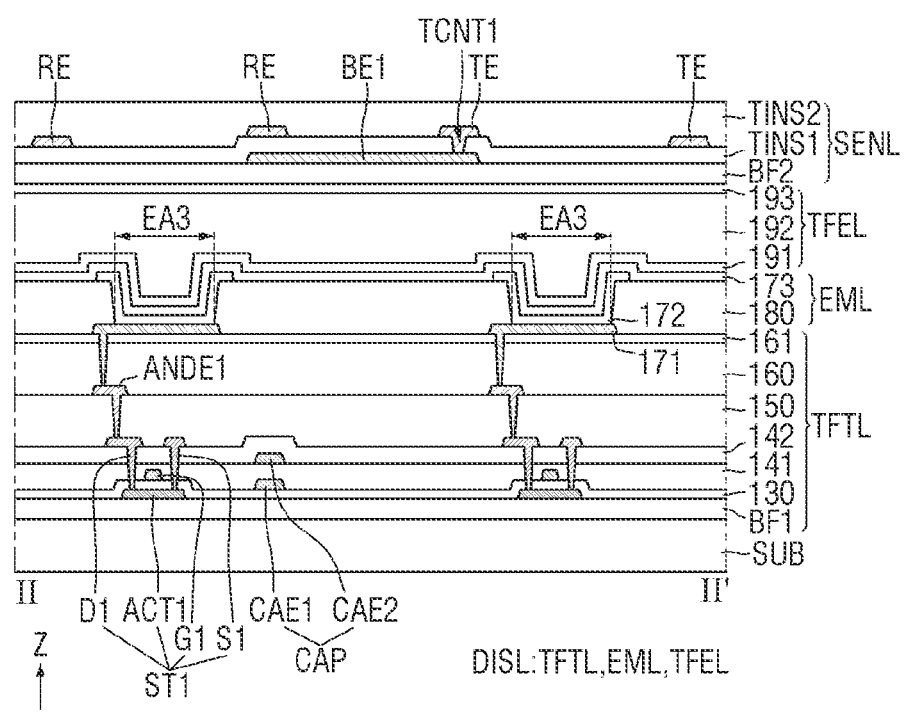
FIG. 8 is a cross-sectional view showing an example of a display panel taken along line II-II' of FIG. 7.

The display layer DISL may include a thin-film transistor layer TFTL in which thin-film transistors are formed, an emission material layer EML in which light-emitting elements to emit light are disposed in the emission areas, and an encapsulation layer TFEL for encapsulating the emission material layer EML, as shown in FIG. 8. In some embodiments, the encapsulation layer TFEL may be a thin-film encapsulation layer.

The sensor electrode layer SENL may be disposed on the display layer DISL. The sensor electrode layer SENL may include sensor electrodes. The sensor electrode layer SENL can sense whether there is a touch of a person and/or an object utilizing (e.g., using) the sensor electrodes.

The polarizing film PF may be disposed on the sensor electrode layer SENL. The polarizing film PF may include a first base member, a linear polarizer, a retardation film including a λ/4 (quarter-wave) plate and/or a λ/2 (half-wave) plate, and a second base member. For example, the first base member, the linear polarizer, the 214 plate, the 212 plate, and the second base member may be sequentially stacked on the sensor electrode layer SENL.

The cover window CW may be disposed on the polarizing film PF. The cover window CW may be coupled (e.g., attached) on the polarizing film PF by a transparent adhesive member such as an optically clear adhesive (OCA) film and/or an optically clear resin (OCR). The cover window CW may include (e.g., be) either an inorganic material such as glass or an organic material such as plastic and/or polymer material.

The bending area BA may be bent along the fifth bending line BL5 and may be disposed on the lower surface of the second side portion SS2. The pad area PA may be bent along the sixth bending line BL6 and may be disposed on the lower surface of the front portion FS. The pad area PA may be coupled (e.g., attached) to the lower surface of the front portion FS by an adhesive member ADH. The adhesive member ADH may be a pressure sensitive adhesive.

FIG. 5 is a layout diagram showing the first to third display areas and the non-display area of the display panel according to an example embodiment of the present disclosure. FIG. 5 is an enlarged view of area A of FIG. 3. FIG. 5 shows the display areas DA1, DA2, and DA3 and the non-display area NDA disposed around the first corner portion CS1 of FIG. 3.

Referring to FIG. 5, a cross point CRP of the first bending line BL1 and the second bending line BL2 may be located in the first display area DA1. In such case, the first display area DA1 may be disposed on the front portion FS, the first side portion SS1, the second side portion SS2 and the first corner portion CS1. The third display area DA3 may be disposed on the first side portion SS1, the second side portion SS2, and the first corner portion CS1. The second display area DA2 may be disposed on the first side portion SS1, the second side portion SS2, and the first corner portion CS1. The non-display area NDA may be disposed on the first side portion SS1, the second side portion SS2, and the first corner portion CS1.

The position of the cross point CRP of the first bending line BL1 and the second bending line BL2 is not limited to that shown in FIG. 5 but may be located in the second display area DA2 or the third display area DA3.

Figure 7:
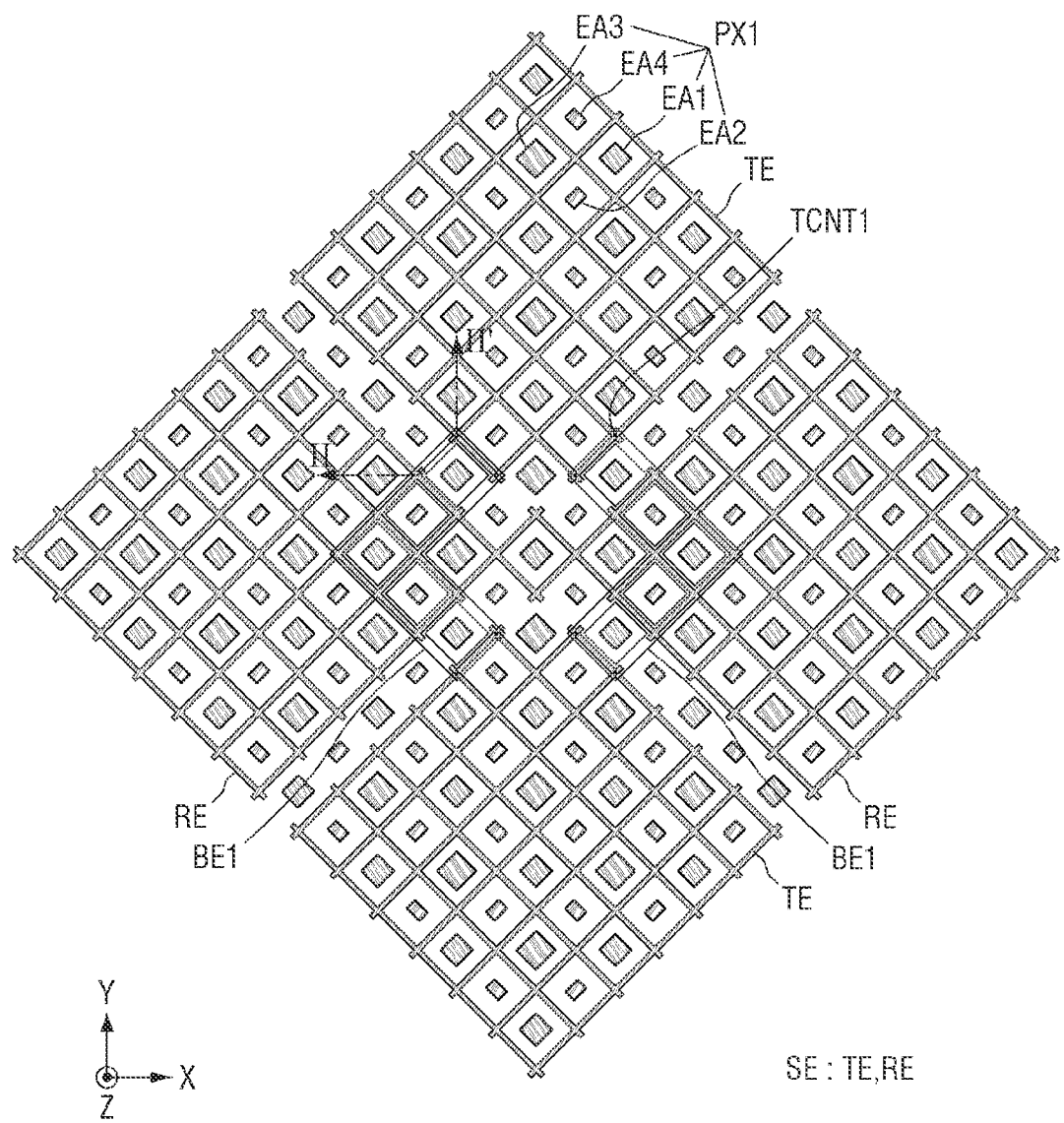
FIG. 7 is a layout diagram showing an example of the first display area of FIG. 5.

The first display area DA1 may include first pixels PX1 that are to display images (see FIG. 7). In addition, the first display area DA1 may include sensor electrodes SE for sensing a user's touch (see FIG. 7). The sensor electrodes SE may include driving electrodes TE and sensing electrodes RE (see FIG. 7). The first pixels PX1, the driving electrodes TE, and the sensing electrodes RE (see FIG. 7) of the first display area DA1 will be described in more detail with reference to FIGS. 7 and 8.

The third display area DA3 may be disposed on the outer side of the first display area DA1. The third display area DA3 may include third pixels PX3 and touch driving lines TL (see FIG. 9). The touch driving lines TL (see FIG. 9) may be coupled (e.g., connected) to the driving electrodes TE (see FIG. 7). The third display area DA3 may include not only the touch driving lines TL (see FIG. 9) but also touch sensing lines coupled (e.g., connected) to the sensing electrodes RE (see FIG. 7).

If a non-display area that displays no image is disposed between the first display area DA1 and the second display area DA2, a user can recognize the non-display area between the first and second display areas DA1 and DA2. For example, the user may recognize a gap between the image displayed by the first display area DA1 and the image displayed by the second display area DA2. In contrast, when the third display area DA3 including third pixels PX3 (see FIG. 9) is formed between (e.g., immediately between) the first display area DA1 and the second display area DA2, it is possible to prevent, or reduce the occurrence of, a gap between the image displayed by the first display area DA1 and the image displayed by the second display area DA2 from being seen (e.g., recognized) by the user.

The second display area DA2 may be disposed on the outer side of the third display area DA3. The non-display area NDA may be disposed on the outer side of the second display area DA2. The second display area DA2 may include cutout patterns CP spaced apart from one another by cutting grooves CG, and cutout connection patterns CBP. The second display area DA2 may include the second pixels PX2 disposed in the cutout patterns CP (see FIG. 11).

The cutout patterns CP and cutout connection patterns CBP may be formed by cutting the display panel 300 with a laser. Accordingly, the cutout groove CG may exist between the cutout patterns CP adjacent to each other and between the cutout connection patterns CBP adjacent to each other.

One end of each of the cutout patterns CP may be coupled (e.g., connected) to the third display area DA3, and another end thereof (e.g., an end opposite to the one end) may be coupled (e.g., connected) to the cutout connection pattern CBP. Each of the cutout patterns CP may be formed in a shape similar to a trapezoidal shape when viewed from the top. In such case, the width of the cutout patterns CP may become narrower from the third display area DA3 toward the cutout connection patterns CBP. However, the present disclosure is not limited thereto. In some embodiments, the cutout patterns CP may be formed in a rectangular shape. In such case, the width of the cutout patterns CP coupled (e.g., connected) to the third display area DA3 may be substantially equal to the width of the cutout patterns CP coupled (e.g., connected) to the cutout connection patterns CBP.

In addition, the length of the cutout pattern CP at the center of the second display area DA2 may be larger than the length of the cutout pattern CP at the edge. Accordingly, the cutout patterns CP adjacent to each other may have different sizes in the second display area DA2. For example, in some embodiments, the size (e.g., planar area in the plan view) of the cutout pattern CP at the center of the second display area DA2 may be larger than the size of the cutout pattern CP at the edge of the second display area DA2. However, the present disclosure is not limited thereto. For example, in some embodiments, the size of the cutout pattern CP at the center of the second display area DA2 may be smaller than the size of the cutout pattern CP at the edge.

The cutout connection patterns CBP may be disposed between the respective cutout patterns CP and the non-display area NDA. One end of each of the cutout connection patterns CBP may be coupled (e.g., connected) to the respective cutout patterns CP and the other end thereof may be coupled (e.g., connected) to the non-display area NDA.

The cutout connection patterns CBP may be formed in a serpentine shape including a plurality of bent portions. For example, the cutout connection patterns CBP may be designed to allow the cutout patterns CP of the second display area DA2 to easily expand and/or contract. Therefore, it is possible to reduce the strain and stress applied to the second display area DA2 due to the double curvature.

The display areas DA1, DA2, and DA3 and the non-display area NDA disposed at the second corner portion CS2, the third corner portion CS3 and the fourth corner portion CS4 shown in FIG. 3 may be similar (e.g., have a similar structure and/or configuration) to those described above with respect to FIG. 5. Therefore, the second corner portion CS2, the third corner portion CS3 and the fourth corner portion CS4 may not be described.

Figure 6:
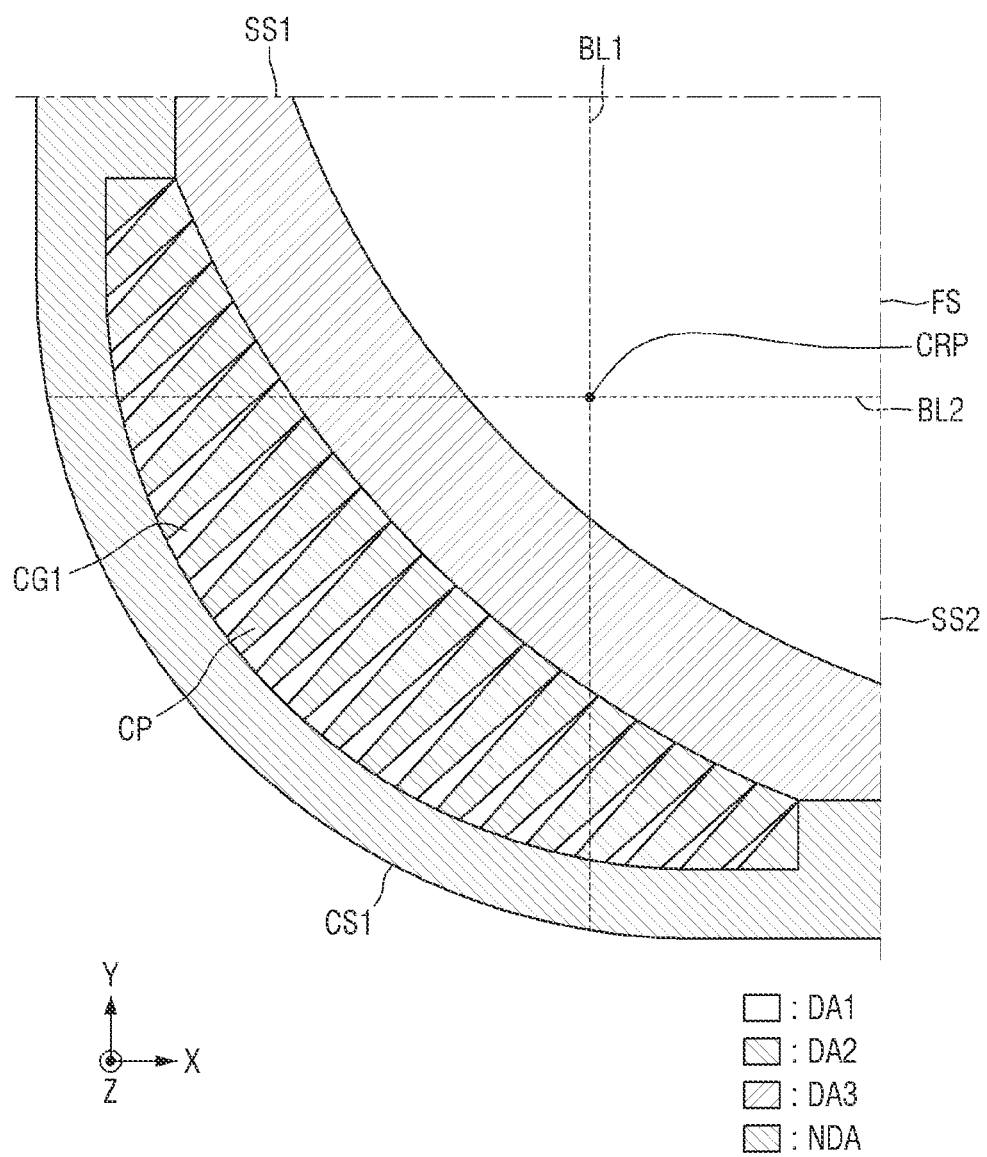
FIG. 6 is a layout diagram showing the first to third display areas and the non-display area of the display panel according to another example embodiment of the present disclosure.

FIG. 6 is a layout diagram showing the first to third display areas and the non-display area of the display panel according to another example embodiment of the present disclosure.

The example embodiment shown in FIG. 6 is substantially identical to the example embodiment of FIG. 5 except that cutout connection patterns CBP are eliminated and that the cutout patterns CP are coupled (e.g., connected) to the non-display area NDA. Therefore, a redundant description thereof may not be provided.

FIG. 7 is a layout diagram showing an example of the first display area of FIG. 5.

FIG. 7 shows the first pixels PX1 of the first display area DA1 and the driving electrodes TE and the sensing electrodes RE of the sensor electrode layer SENL (see FIG. 4). In the example shown in FIG. 7, a user's touch is sensed by mutual capacitive sensing by utilizing (e.g., using) two kinds of sensor electrodes, e.g., driving electrodes TE and sensing electrodes RE. For convenience of illustration, FIG. 7 shows only two sensing electrodes RE adjacent to each other in the first direction (X-axis direction) and two driving electrodes TE adjacent to each other in the second direction (Y-axis direction).

Referring to FIG. 7, the driving electrodes TE may be electrically separated from the sensing electrodes RE. The driving electrodes TE and the sensing electrodes RE are formed on the same layer and thus they may be spaced apart from each other. There may be a gap between the driving electrodes TE and the sensing electrodes RE.

The sensing electrodes RE may be electrically coupled (e.g., connected) to one another in the first direction (X-axis direction). The driving electrodes TE may be electrically coupled (e.g., connected) to one another in the second direction (Y-axis direction). In order to electrically separate the sensing electrodes RE from the driving electrodes TE at their crossings or intersections, the driving electrodes TE adjacent to one another in the second direction (Y-axis direction) may be coupled (e.g., connected) through connection electrodes BE1 (e.g., a plurality of connection electrodes BE1).

The connection electrodes BE1 may be formed on a different layer from the driving electrodes TE and the sensing electrodes RE, and the connection electrodes BE1 may be coupled (e.g., connected) to the driving electrodes TE through first touch contact holes TCNT1. One end of each of the connection electrodes BE1 may be coupled (e.g., connected) to one of the driving electrodes TE adjacent to each other in the second direction (Y-axis direction) through the first touch contact hole TCNT1. The other end of each of the connection electrodes BE1 may be coupled (e.g., connected) to another one of the driving electrodes TE adjacent to each other in the second direction (Y-axis direction) through the first touch contact hole TCNT1. The connection electrodes BE1 may overlap the sensing electrodes RE in the third direction (Z-axis direction) (e.g., in the plan view). Because the connection electrodes BE1 are formed on a different layer from the driving electrodes TE and the sensing electrodes RE, they can be electrically separated from the sensing electrodes RE even though they overlap the sensing electrodes RE in the third direction (Z-axis direction).

Each of the connection electrodes BE1 may be bent at least once. Although the connection electrodes BE1 are bent in the shape of angle brackets "<" or ">" in the example shown in FIG. 6, the shape of the connection electrodes BE1 is not limited thereto. In some embodiments, because the driving electrodes TE adjacent to each other in the second direction (Y-axis direction) are coupled (e.g., connected) by the plurality of connection electrodes BE1, even if any of the connection electrodes BE1 is uncoupled (e.g., disconnected), the driving electrodes TE adjacent to each other in the second direction (Y-axis direction) can still be electrically coupled (e.g., connected) with each other.

Each of the driving electrodes TE and the sensing electrodes RE may have a mesh structure when viewed from the top (e.g., from the plan view). Because the driving electrodes TE and the sensing electrodes RE are formed on the encapsulation layer TFEL (see FIG. 8), the distance from a common electrode 173 (see FIG. 8) to the driving electrode TE and/or the sensing electrode RE is small. Therefore, a parasitic capacitance may be formed between the common electrode 173 (see FIG. 8) and the driving electrode TE and/or the sensing electrode RE. The parasitic capacitance between the common electrode 173 and the driving electrode TE or the sensing electrode RE is respectively proportional to the area where the common electrode 173 (see FIG. 8) and the driving electrode TE or the sensing electrode RE overlap each other. In order to reduce such parasitic capacitance, the driving electrodes TE and the sensing electrodes RE may have a mesh structure when viewed from the top (e.g., from the plan view).

The first display area DA1 may include the first pixels PX1 for displaying an image. Each of the first pixels PX1 may include a plurality of emission areas EA1, EA2, EA3 and EA4. For example, each of the first pixels PX1 may include a first emission area EA1, a second emission area EA2, a third emission area EA3, and a fourth emission area EA4. The first emission area EA1 refers to an emission area of a first sub-pixel that is to emit a first light, and the second emission area EA2 refers to an emission area of a second sub-pixel that is to emit a second light. The third emission area EA3 refers to an emission area of a third sub-pixel that is to emit a third light, and the fourth emission area EA4 refers to an emission area of a fourth sub-pixel that is to emit a fourth light.

The first emission area EA1, the second emission area EA2, the third emission area EA3 and the fourth emission area EA4 may emit lights of different colors. In some embodiments, two of the first emission area EA1, the second emission area EA2, the third emission area EA3 and the fourth emission area EA4 may emit light of the same color. For example, the first emission area EA1 may emit light of red color, the second emission area EA2 and the fourth emission area EA4 may emit light of green color, and the third emission area EA3 may emit light of blue color.

Each of the first emission area EA1, the second emission area EA2, the third emission area EA3 and the fourth emission area EA4 may have, but is not limited to, a quadrangular shape such as a diamond when viewed from the top (e.g., from the plan view). For example, the first emission area EA1, the second emission area EA2, the third emission area EA3 and the fourth emission area EA4 may have other suitable polygonal shapes than a quadrangular shape, a circular shape, or an elliptical shape when viewed from the top (e.g., from the plan view). In the example shown in FIG. 6, the third emission area EA3 has the largest area, the first emission area EA1 has the second largest area, and the second emission area EA2 and the fourth emission area EA4 have the smallest areas. It is, however, to be understood that the present disclosure is not limited thereto.

Because the driving electrodes TE, the sensing electrodes RE, and the connection electrodes BE1 are formed in a mesh structure when viewed from the top (e.g., from the plan view), the emission area EA1, EA2, EA3 and EA4 may not overlap the driving electrodes TE, the sensing electrodes RE and the connection electrodes BE1 in the third direction (Z-axis direction) (e.g., from the plan view). As a result, the light emitted from the emission areas EA1, EA2, EA3 and EA4 is not blocked, or is less blocked, by the driving electrodes TE, the sensing electrodes RE, and the connection electrodes BE1, and thus, it is possible to avoid or reduce the luminance of the light from being lowered by the electrodes.

FIG. 8 is a cross-sectional view showing an example of a display panel taken along line II-II' of FIG. 7.

Referring to FIG. 8, the display layer DISL including the thin-film transistor layer TFTL, the emission material layer EML, and the encapsulation layer TFEL may be disposed on the substrate SUB, and the sensor electrode layer SENL including the driving electrodes TE, the sensing electrodes RE, and the connection electrodes BE1 may be disposed on the display layer DISL.

The substrate SUB may be made of an insulating material such as a polymer resin and/or glass. For example, the substrate SUB may include (e.g., be) polyimide. In such case, the substrate SUB may be a suitably flexible substrate that can be bent, folded, and/or rolled.

The thin-film transistor layer TFTL including first thin-film transistors ST1 may be disposed on the substrate SUB. The thin-film transistor layer TFTL may include the first thin-film transistor ST1, a first connection electrode ANDE1, a first buffer layer BF1, a gate insulator 130, a first interlayer dielectric layer 141, and a second interlayer dielectric layer 142, a first planarization layer 150, and a second planarization layer 160.

The first buffer layer BF1 may be disposed on the substrate SUB. The first buffer layer BF1 may be formed of a silicon nitride layer, a silicon oxynitride layer, a silicon oxide layer, a titanium oxide layer, and/or an aluminum oxide layer.

The first thin-film transistor ST1 may be disposed on the first buffer layer BF1. The first thin-film transistor ST1 may include a first active layer ACT1, a first gate electrode G1, a first source electrode S1, and a first drain electrode D1.

The first active layer ACT1 of the first thin-film transistor ST1 may be disposed on the first buffer layer BF1. The first active layer ACT1 may include (e.g., be) silicon semiconductor such as polycrystalline silicon, monocrystalline silicon, low-temperature polycrystalline silicon and/or amorphous silicon. The part of the first active layer ACT1 overlapping the first gate electrode G1 in the third direction (Z-axis direction) (e.g., in the plan view) may be defined as a channel region. The other parts of the first active layer ACT1 not overlapping the first gate electrode G1 in the third direction (Z-axis direction) may be defined as conductive regions. The conductive regions of the first active layer ACT1 may have conductivity by doping a silicon semiconductor with ions and/or impurities.

The gate insulator 130 may be formed on the first active layer ACT1 of the first thin film transistor ST1. The gate insulator 130 may be formed of an inorganic layer(s), for example, a silicon nitride layer, a silicon oxynitride layer, a silicon oxide layer, a titanium oxide layer, and/or an aluminum oxide layer.

The first gate electrode G1 of the first thin-film transistor ST1 and a first capacitor electrode CAE1 may be disposed on the gate insulator 130. The first gate electrode G1 of the first thin-film transistor ST1 may overlap the first active layer ACT1 in the third direction (Z-axis direction) (e.g., in the plan view). The first capacitor electrode CAE1 may overlap a second capacitor electrode CAE2 in the third direction (Z-axis direction) (e.g., in the plan view). The first gate electrode G1 and the capacitor electrode CAE1 may be made up of a single layer or multiple layers of one of molybdenum (Mo), aluminum (Al), chromium (Cr), gold (Au), titanium (Ti), nickel (Ni), neodymium (Nd), and copper (Cu) or an alloy thereof.

The first interlayer dielectric layer 141 may be disposed on the first gate electrode G1 and the first capacitor electrode CAE1. The first interlayer dielectric layer 141 may be formed of an inorganic layer, for example, a silicon nitride layer, a silicon oxynitride layer, a silicon oxide layer, a titanium oxide layer, and/or an aluminum oxide layer. The first interlayer dielectric layer 141 may include a number of inorganic layers.

The second capacitor electrode CAE2 may be disposed on the first interlayer dielectric layer 141. The second capacitor electrode CAE2 may overlap the first capacitor electrode CAE1 in the third direction (Z-axis direction) (e.g., in the plan view). Because the first interlayer dielectric layer 141 has a predetermined or set dielectric constant, a capacitor can be formed by the first capacitor electrode CAE1, the second capacitor electrode CAE2 and the first interlayer dielectric layer 141. The second capacitor electrode CAE2 may be made up of a single layer or multiple layers of one of molybdenum (Mo), aluminum (Al), chromium (Cr), gold (Au), titanium (Ti), nickel (Ni), neodymium (Nd), and copper (Cu) or an alloy thereof.

The second interlayer dielectric layer 142 may be disposed over the second capacitor electrode CAE2. The second interlayer dielectric layer 142 may be formed of an inorganic layer, for example, a silicon nitride layer, a silicon oxynitride layer, a silicon oxide layer, a titanium oxide layer, and/or an aluminum oxide layer.

The first source electrode S1 and the first drain electrode D1 of the first thin-film transistor ST1 may be disposed on the second interlayer dielectric layer 142. The first source electrode S1 and the first drain electrode D1 may be made up of a single layer of one of molybdenum (Mo), aluminum (Al), chromium (Cr), gold (Au), titanium (Ti), nickel (Ni), neodymium (Nd), and copper (Cu) or an alloy thereof, or multiple layers thereof.

The first source electrode S1 of the first thin-film transistor ST1 may be coupled (e.g., connected) to the conductive region located on a first side of the channel region of the first active layer ACT1 through a contact hole penetrating through the gate insulator 130, the first interlayer dielectric layer 141 and the second interlayer dielectric layer 142. The first drain electrode D1 of the first thin-film transistor ST1 may be coupled (e.g., connected) to the conductive region located on an opposite side of the channel region of the first active layer ACT1 from the first side of the channel region through a contact hole penetrating through the gate insulator 130, the first interlayer dielectric layer 141 and the second interlayer dielectric layer 142.

The first planarization layer 150 may be disposed on the first source electrode S1 and the first drain electrode D1 to provide a flat surface over the thin-film transistors having different levels. The first planarization layer 150 may be formed of an organic layer such as an acryl resin, an epoxy resin, a phenolic resin, a polyamide resin, and/or a polyimide resin.

The first connection electrode ANDE1 may be disposed on the first planarization layer 150. The first connection electrode ANDE1 may be coupled (e.g., connected) to the first source electrode S1 or the first drain electrode D1 of the first thin film transistor ST1 through a contact hole penetrating the first planarization layer 150. The first connection electrode ANDE1 may be made up of a single layer or multiple layers of one of molybdenum (Mo), aluminum (Al), chromium (Cr), gold (Au), titanium (Ti), nickel (Ni), neodymium (Nd), and copper (Cu) or an alloy thereof.

The second planarization layer 160 may be disposed on the first connection electrode ANDE1. The second planarization layer 160 may be formed of an organic layer such as an acryl resin, an epoxy resin, a phenolic resin, a polyamide resin, and/or a polyimide resin.

A first inorganic layer 161 may be disposed on the second planarization layer 160. The first inorganic layer 161 may be made up of a silicon nitride layer, a silicon oxynitride layer, a silicon oxide layer, a titanium oxide layer, and/or an aluminum oxide layer.

The emission material layer EML is disposed on the thin-film transistor layer TFTL. The emission material layer EML may include light-emitting elements and a bank 180.

Each of the light-emitting elements may include a pixel electrode 171, an emissive layer 172, and a common electrode 173. In each of the emission areas EA1, EA2, EA3 and EA4, the pixel electrode 171, the emissive layer 172 and the common electrode 173 are stacked on one another sequentially, so that holes from the pixel electrode 171 and electrons from the common electrode 173 are combined with each other in the emissive layer 172 to emit light. In such case, the pixel electrode 171 may be an anode electrode while the common electrode 173 may be a cathode electrode. Although the third emission area EA3 is shown in FIG. 8, the first emission area EA1, the second emission area EA2 and the fourth emission area EA4 may be substantially identical to (e.g., may have substantially the same structure and/or configuration as) the third emission area EA3 shown in FIG. 8.

The pixel electrode 171 may be formed on the first inorganic layer 161. The pixel electrode 171 may be coupled (e.g., connected) to the first connection electrode ANDE1 through a contact hole penetrating the first inorganic layer 161 and the second planarization layer 160.

In a top-emission structure where light exits from the emissive layer 172 toward the common electrode 173, the pixel electrode 171 may be made up of a single layer of molybdenum (Mo), titanium (Ti), copper (Cu) and/or aluminum (Al), or may be made up of a stack structure of aluminum and titanium (Ti/Al/Ti), a stack structure of aluminum and ITO (ITO/Al/ITO), an APC alloy, and/or a stack structure of APC alloy and ITO (ITO/APC/ITO) in order to increase the reflectivity. The APC alloy is an alloy of silver (Ag), palladium (Pd) and copper (Cu).

The bank 180 serves to define each of the emission areas EA1, EA2, EA3, and EA4 of the display pixels. To this end, the bank 180 may be formed on the first inorganic layer 161 to expose a part of the pixel electrode 171. The bank 180 may cover the edge of the pixel electrode 171. The pixel electrode 171 may be disposed in a contact hole penetrating through the first inorganic layer 161 and the second planarization layer 160. Accordingly, the contact hole penetrating the first inorganic layer 161 and the second planarization layer 160 may be filled with the pixel electrode 171. The bank 180 may be formed of an organic layer such as an acryl resin, an epoxy resin, a phenolic resin, a polyamide resin and/or a polyimide resin.

The emissive layer 172 is formed on the pixel electrode 171. The emissive layer 172 may include (e.g., be) an organic material and emit light of a certain color. For example, the emissive layer 172 may include a hole transporting layer, an organic material layer, and an electron transporting layer. The organic material layer may include (e.g., be) a host and a dopant. The organic material layer may include (e.g., be) a material that is to emit a predetermined or set light (e.g., light having a predetermined or set color or wavelength), and may be formed utilizing (e.g., using) a phosphor and/or a fluorescent material.

The common electrode 173 is formed on the emissive layer 172. The common electrode 173 may be formed to cover the emissive layer 172. The common electrode 173 may be a common layer formed across the display pixels. A capping layer may be formed on the common electrode 173.

In the top-emission structure, the common electrode 173 may be formed of a transparent conductive material (TCP) such as ITO and/or IZO that can transmit light, or a semi-transmissive conductive material such as magnesium (Mg), silver (Ag) and/or an alloy of magnesium (Mg) and silver (Ag). When the common electrode 173 is formed of a semi-transmissive metal material, the light extraction efficiency can be increased by utilizing (e.g., using) microcavities.

The encapsulation layer TFEL may be formed on the emission material layer EML. The encapsulation layer TFEL may include at least one inorganic layer to prevent or block permeation of oxygen and/or moisture into the emission material layer EML. In addition, the encapsulation layer TFEL may include at least one organic layer to protect the emission material layer EML from particles.

For example, the encapsulation layer TFEL may include a first inorganic encapsulation layer 191 disposed on the common electrode 173, a second organic encapsulation layer 192 disposed on the first inorganic encapsulation layer 191, and a second inorganic encapsulation layer 193 disposed on the second organic encapsulation layer 192. The first inorganic encapsulation layer 191 and the second inorganic encapsulation layer 193 may each be made up of multiple layers in which one or more inorganic layers of a silicon nitride layer, a silicon oxynitride layer, a silicon oxide layer, a titanium oxide layer, and an aluminum oxide layer are alternately stacked on one another. The organic layer may be an acryl resin, an epoxy resin, a phenolic resin, a polyamide resin, and/or a polyimide resin.

The sensor electrode layer SENL is disposed on the encapsulation layer TFEL. The sensor electrode layer SENL may include the driving electrodes TE, the sensing electrodes RE, and the connection electrodes BE1.

A second buffer layer BF2 may be disposed on the encapsulation layer TFEL. The second buffer layer BF2 may include at least one inorganic layer. For example, the second buffer layer BF2 may be made up of multiple layers in which one or more inorganic layers of a silicon nitride layer, a silicon oxynitride layer, a silicon oxide layer, a titanium oxide layer, and an aluminum oxide layer are alternately stacked on one another.

The connection electrodes BE1 may be disposed on the second buffer layer BF2. The connection electrodes BE1 may be made up of a single layer of molybdenum (Mo), titanium (Ti), copper (Cu), and/or aluminum (Al), or may be made up of a stack structure of aluminum and titanium (Ti/Al/Ti), a stack structure of aluminum and ITO (ITO/Al/ITO), an APC alloy, and/or a stack structure of an APC alloy and ITO (ITO/APC/ITO).

A first sensor insulating layer TINS1 may be disposed on the connection electrodes BE1. The first sensor insulating layer TINS1 may be formed of an inorganic layer, for example, a silicon nitride layer, a silicon oxynitride layer, a silicon oxide layer, a titanium oxide layer, or an aluminum oxide layer.

The driving electrodes TE and the sensing electrodes RE may be disposed on the first sensor insulating layer TINS1. In order to prevent, or reduce the occurrence of, the light emitted from the emission areas EA1, EA2, EA3 and EA4 from being blocked by the driving electrodes TE and/or the sensing electrodes RE to thereby decrease the luminance of the light, the driving electrodes TE and the sensor electrodes RE do not overlap the emission areas EA1, EA2, EA3 and EA4. The driving electrodes TE and the sensing electrodes RE may be made up of a single layer of molybdenum (Mo), titanium (Ti), copper (Cu), or aluminum (Al), or may be made up of a stack structure of aluminum and titanium (Ti/Al/Ti), a stack structure of aluminum and ITO (ITO/Al/ITO), an APC alloy, or a stack structure of an APC alloy and ITO (ITO/APC/ITO).

A second sensor insulating layer TINS2 may be disposed on the driving electrodes TE and the sensing electrodes RE. The second sensor insulating layer TINS2 may include an inorganic layer and/or an organic layer. The inorganic layer may be a silicon nitride layer, a silicon oxynitride layer, a silicon oxide layer, a titanium oxide layer, or an aluminum oxide layer. The organic layer may be an acryl resin, an epoxy resin, a phenolic resin, a polyamide resin and/or a polyimide resin.

Figure 9:
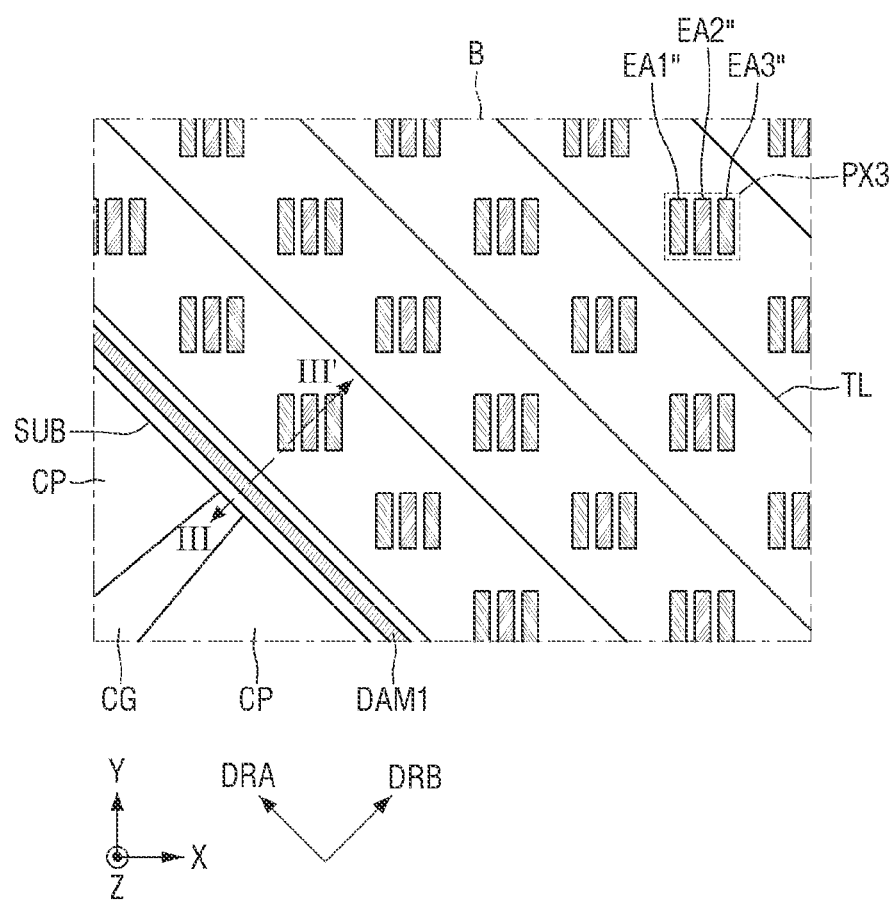
FIG. 9 is a layout diagram showing an example of the third display area of FIG. 5.

FIG. 9 is a layout diagram showing an example of the third display area of FIG. 5. FIG. 9 is an enlarged view of area B of FIG. 5.

Referring to FIG. 9, touch driving lines TL may be extended (e.g., may extend) in an A-direction DRA. The A-direction DRA may be inclined by 135 degrees from the first direction (X-axis direction) and by 45 degrees from the second direction (Y-axis direction). The touch driving lines TL may be arranged with each other in a B-direction DRB crossing the A-direction DRA. The B-direction DRB may be inclined by 45 degrees from the first direction (X-axis direction) and by 45 degrees from the second direction (Y-axis direction).

Third pixels PX3 may be disposed between the touch driving lines TL adjacent to each other. The third pixels PX3 disposed between the touch driving lines TL adjacent to each other may be arranged with each other in the A-direction DRA. At least one touch driving line TL may be disposed between the second emission areas EA2" adjacent to each other in the B-direction DRB. The spacing distance between the touch driving lines TL in the B-direction DRB and the spacing distance between the third pixels PX3 in the B-direction DRB may be approximately several tens of μm. As used herein, the term μm may mean a distance equal to $10^{-6}$ meters.

Each of the third pixels PX3 may include a plurality of emission areas EA1", EA2", and EA3". The number of the emission areas EA1", EA2", and EA3" of each of the third pixels PX3 may be different from the number of the emission areas EA1, EA2, EA3 and EA4 of each of the first pixels PX1.

For example, each of the third pixels PX3 may include a first emission area EA1", a second emission area EA2", and a third emission area EA3". The first emission area EA1" refers to the emission area of the first sub-pixel to emit first light, the second emission area EA2" refers to the emission area of the second sub-pixel to emit second light, and the third emission area EA3" refers to the emission area of the third sub-pixel that is to emit third light.

The first emission area EA1", the second emission area EA2", and the third emission area EA3" may emit lights of different colors. For example, the first emission area EA1" may emit light of red color, the second emission area EA2" may emit light of green color, and the third emission area EA3" may emit light of blue color.

The first emission area EA1", the second emission area EA2", and the third emission area EA3" may be arranged in the first direction (X-axis direction). In some embodiments, the first emission area EA1", the second emission area EA2", and the third emission area EA3" may be arranged in the B-direction DRB.

The shape of each of the emission areas EA1", EA2", and EA3" of the third pixels PX3 may be different from the shape of each of the emission areas EA1, EA2, EA3 and EA4 of the first pixels PX1 when viewed from the top (e.g., from the plan view). For example, each of the first emission area EA1", the second emission area EA2", and the third emission area EA3" may have a rectangular shape when viewed from the top (e.g., from the plan view). Each of the first emission area EA1", the second emission area EA2", and the third emission area EA3" may have a rectangular shape having shorter sides in the first direction (X-axis direction) and longer sides in the second direction (Y-axis direction) when viewed from the top (e.g., from the plan view).

It is, however, to be understood that the shape of each of the first emission areas EA1", the second emission areas EA2", and the third emission areas EA3" when viewed from the top (e.g., from the plan view) is not limited thereto. Each of the first emission areas EA1", the second emission areas EA2", and the third emission areas EA3" may have other suitable polygonal shapes than a quadrangular shape, a circular shape, or an elliptical shape when viewed from the top (e.g., from the plan view). Although the first emission area EA1", the second emission area EA2", and the third emission area EA3" have substantially the same area (e.g., planar area in the plan view) in the example shown in FIG. 9, the present disclosure is not limited thereto. At least one selected from among the first emission area EA1", the second emission area EA2", and the third emission area EA3" may have a different area than the others.

A first dam DAM1 may be disposed at an edge of the third display area DA3 adjacent to the second display area DA2. The first dam DAM1 may be disposed between the touch driving line TL and the cutout pattern CP of the second display area DA2. The first dam DAM1 may be a feature for preventing or blocking overflow of the second organic encapsulation layer 192 (see FIG. 10) of the encapsulation layer TFEL. The first dam DAM1 may be extended (e.g., may extend) in the A-direction DRA.

As shown in FIG. 9, a third display area DA3 including third pixels PX3 to display images is disposed between the first display area DA1 and the second display area DA2. Therefore, it is possible to prevent, or reduce the occurrence of, a user from recognizing a gap between the image displayed on the first display area DA1 and the image displayed on the second display area DA2.

Figure 10:
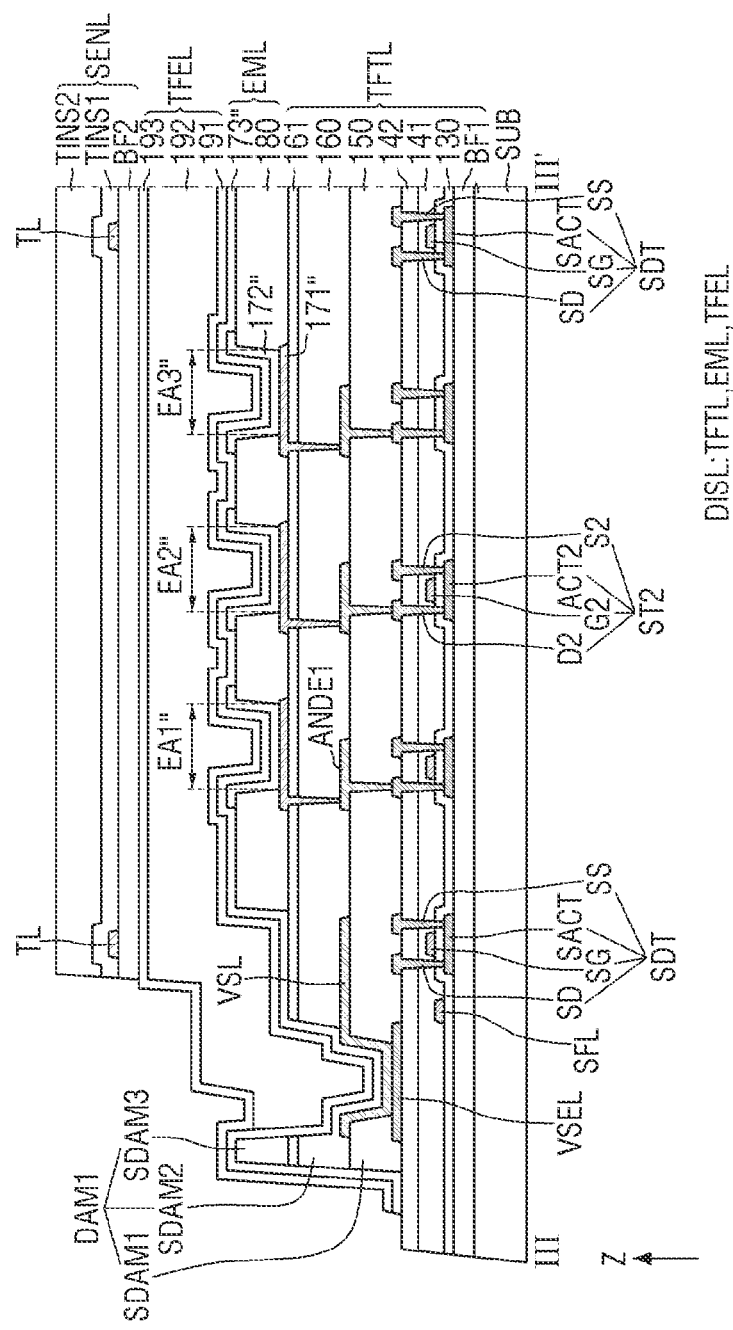
FIG. 10 is a cross-sectional view showing an example of the display panel taken along line III-III' of FIG. 9.

FIG. 10 is a cross-sectional view showing an example of the display panel taken along line III-III' of FIG. 9.

A second thin-film transistor ST2 of the thin-film transistor layer TFTL, the first emission area EA1", the second emission area EA2" and the third emission area EA3" of FIG. 10 may be substantially identical to the first thin-film transistor ST1 of the thin-film transistor layer TFTL and the third emission area EA3; and, therefore, the redundant description may not be provided.

In order to prevent, or reduce the occurrence of, the luminance of the light from being reduced as the light emitted from the emission areas EA1", EA2", and EA3" is blocked by the driving electrodes TE and the sensing electrodes RE, the touch driving lines TL do not overlap with the first emission area EA1", the second emission area EA2", or the third emission area EA3". The touch driving lines TL may be disposed on the second buffer layer BF2. The touch driving lines TL may be made of the same material on the same layer as the connection electrodes BE1 of FIG. 8.

A scan driving transistor SDT of a scan driver circuit may include a scan active layer SACT, a scan gate electrode SG, a scan source electrode SS and a scan drain electrode SD. The scan active layer SACT, the scan gate electrode SG, the scan source electrode SS, and the scan drain electrode SD of the scan driving transistor SDT may be substantially identical to the first active layer ACT1, the first gate electrode G1, the first source electrode S1, and the first drain electrode D1 of the first thin-film transistor ST1, respectively, described above with reference to FIG. 8. Therefore, the redundant description may not be provided.

The scan driving transistor SDT is disposed in the thin-film transistor layer TFTL together with the second thin-film transistors ST2 for driving the first emission area EA1", the second emission area EA2", and the third emission area EA3" of the third pixels PX3. Therefore, the scan driving transistor SDT may be disposed in a position where the second thin-film transistors ST2 are not disposed in order to avoid the second thin-film transistors ST2. For example, the scan driving transistors SDT may be spaced apart from the second thin-film transistors ST2 in the plan view so that the scan driving transistors SDT and the second thin-film transistors ST2 do not interfere with each other. Because the touch driving lines TL are disposed not to overlap with the first emission area EA1", the second emission area EA2", and the third emission area EA3", the scan driving transistor SDT may overlap with the touch driving line TL in the third direction (Z-axis direction) (e.g., in the plan view).

A first voltage connection line VSEL may be disposed on the second interlayer dielectric layer 142. The first voltage connection line VSEL may be made of the same material as the first source electrode S1 and the first drain electrode D1 of the first thin-film transistor ST1, the second source electrode S2 and the second drain electrode D2 of the second thin-film transistor ST2, and the scan source electrode SS and the scan drain electrode SD of the scan driving transistor SDT.

A first voltage line VSL may be disposed on the first planarization layer 150. In some embodiments, the first voltage line VSL may be a first supply voltage line. The first voltage line VSL may be formed of the same material as a first connection electrode ANDE1. The first voltage line VSL may be coupled (e.g., connected) to the first voltage connection line VSEL through a contact hole penetrating the first planarization layer 150. A first supply voltage may be applied to the first voltage line VSL.

The common electrode 173" may be coupled (e.g., connected) to a first voltage line VSL through a contact hole penetrating the second planarization layer 160. The first supply voltage of the first voltage line VSL may be applied to the common electrode 173".

The first dam DAM1 may be disposed in the third display area DA3 to prevent or block the second organic encapsulation layer 192 of the thin-film encapsulation layer from overflowing. The first dam DAM1 may include a first sub-dam SDAM1 made of the same material as the first planarization layer 150, a second sub-dam SDAM2 made of the same material as the second planarization layer 160, and a third sub-dam SDAM3 made of the same material as the bank 180. Due to the first dam DAM1, the end of the second organic encapsulation layer 192 may be disposed between the outermost first emission area EA1" and the first dam DAM1. The first inorganic encapsulation layer 191 and the second inorganic encapsulation layer 193 may be disposed on the first dam DAM1. The first inorganic encapsulation layer 191 and the second inorganic encapsulation layer 193 may be in contact with each other on the first dam DAM1.

Another dam for confining the second organic encapsulation layer 192 which flows over the first dam DAM1 may be disposed on the outer side of the first dam DAM1. The other dam may have substantially the same structure as the first dam DAM1. In some embodiments, the other dam may include at least one selected from among the first sub-dam SDAM1, the second sub-dam SDAM2 and the third sub-dam SDAM3 of the first dam DAM1.

As shown in FIG. 10, the scan driving transistors SDT of the scan driver circuit may be disposed at positions where the second thin-film transistors ST2 are not disposed in order to avoid the second thin-film transistors ST2 for driving the first emission area EA1", the second emission area EA2", and the third emission area EA3" of the third pixel PX3. In such case, because the touch driving lines TL are disposed not to overlap with the first emission area EA1", the second emission area EA2", and the third emission area EA3", the scan driving transistor SDT may overlap with the touch driving line TL in the third direction (Z-axis direction) (e.g., in the plan view).

Figure 11:
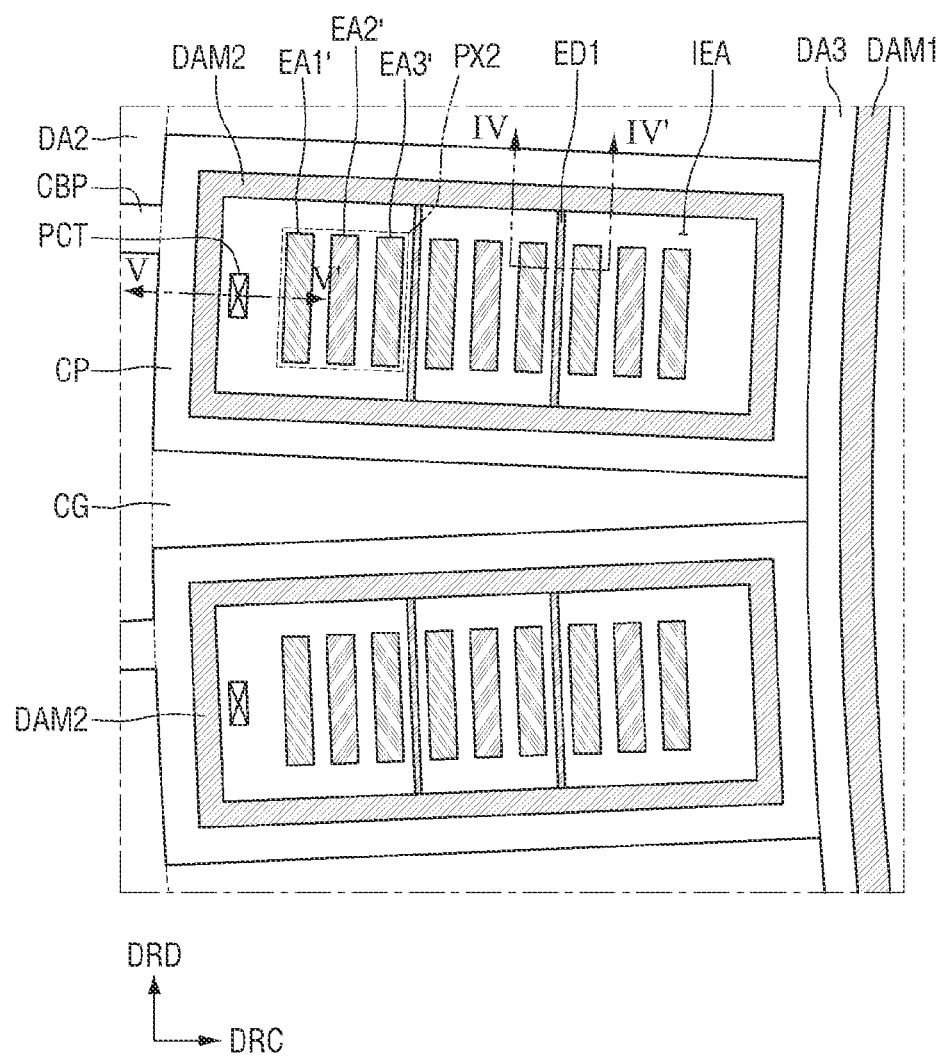
FIG. 11 is a layout diagram showing an example of the second display area of FIG. 5.

FIG. 11 is a layout diagram showing an example of the second display area of FIG. 5.

Referring to FIG. 11, the second display area DA2 may include cutout patterns CP and cutting grooves CG. The cutout patterns CP may be formed by cutting the display panel 300 with a laser. Accordingly, the cutting grooves CG may be formed between the cutout patterns CP adjacent to each other.

One end of each of the cutout patterns CP may be coupled (e.g., connected) to the third display area DA3, and another end thereof may be coupled (e.g., connected) to cutout connection patterns CBP or the non-display area NDA. The cutout patterns CP may be formed in a shape similar to a trapezoidal shape when viewed from the top (e.g., from the plan view). The width of the cutout patterns CP may be wider or narrower from the third display area DA3 toward the cutout connection patterns CBP or the non-display area NDA. In some embodiments, a width of the cutout patterns CP at the third display area DA3 may be greater than a width of the cutout patterns CP at the cutout connection patterns CBP. For example, a width of the cutout patterns CP may vary, continuously or non-continuously, from the third display area DA3 toward (e.g., to) the cutout connection patterns CBP. For example, the width of the cutout patterns CP may vary along a length of the cutout patterns CP from the third display area DA3 to the cutout connection patterns CBP. In addition, the cutout patterns CP may be formed in a rectangular shape, a diamond shape or any suitable polygonal shape other than a quadrangular shape when viewed from the top (e.g., from the plan view).

The second pixels PX2, second dams DAM2, and a power contact hole PCT may be disposed in each of the cutout patterns CP.

The second pixels PX2 may be arranged in (e.g., arranged along) a C-direction DRC. The second dam DAM2 may be disposed to be around (e.g., to surround) the second pixels PX2. The second dam DAM2 may be disposed at the edges of each of the cutout patterns CP. For example, a second dam DAM2 may extend along a border of a corresponding cutout pattern CP to surround the second pixels PX2 of the corresponding cutout pattern CP.

Each of the second pixels PX2 may include a plurality of emission areas EA1', EA2', and EA3'. The number of the emission areas EA1', EA2', and EA3' of each of the second pixels PX2 may be different from the number of the emission areas EA1, EA2, EA3, and EA4 of each of the first pixels PX1. The number of the emission areas EA1', EA2', and EA3' of each of the second pixels PX2 may be equal to, but is not limited to being equal to, the number of the emission areas EA1", EA2", EA3" of each of the third pixels PX3. The number of the emission areas EA1', EA2', and EA3' of each of the second pixels PX2 may be different from the number of the emission areas EA1", EA2", and EA3" of each of the third pixels PX3.

For example, each of the second pixels PX2 may include a first emission area EA1', a second emission area EA2', and a third emission area EA3'. The first emission area EA1' refers to the emission area of the first sub-pixel to emit first light, the second emission area EA2' refers to the emission area of the second sub-pixel to emit second light, and the third emission area EA3' refers to the emission area of the third sub-pixel that is to emit third light.

The first emission area EA1', the second emission area EA2', and the third emission area EA3' may emit lights of different colors. For example, the first emission area EA1' may emit light of red color, the second emission area EA2' may emit light of green color, and the third emission area EA3' may emit light of blue color.

The first emission area EA1', the second emission area EA2', and the third emission area EA3' may be arranged in the C-direction DRC. Each of the first emission area EA1', the second emission area EA2', and the third emission area EA3' may have a rectangular shape when viewed from the top (e.g., from the plan view). For example, each of the first emission area EA1', the second emission area EA2', and the third emission area EA3' may have a rectangular shape having shorter sides in the C-direction DRC and longer sides in a D-direction DRD when viewed from the top (e.g., from the plan view). It is, however, to be understood that the present disclosure is not limited thereto. Each of the first emission areas EA1', the second emission areas EA2', and the third emission areas EA3' may have other suitable polygonal shapes than a quadrangular shape, a circular shape, or an elliptical shape when viewed from the top (e.g., from the plan view). Although the first emission area EA1', the second emission area EA2', and the third emission area EA3' have substantially the same area in the example shown in FIG. 11, the present disclosure is not limited thereto. At least one selected from among the first emission area EA1', the second emission area EA2', and the third emission area EA3' may have a different area than the others.

A first encapsulation divider ED1 may be disposed between the second pixels PX2 adjacent to each other. When the first encapsulation divider ED1 is disposed between adjacent second pixels PX2 in the C-direction DRC, it may be extended (e.g., may extend) in the D-direction DRD. The first encapsulation divider ED1 may be coupled (e.g., connected) to the second dam DAM2. For example, a first encapsulation divider ED1 may extend between two adjacent second pixels PX2 from one part of the second dam DAM2 to another part of the second dam DAM2. For example, the first encapsulation divider ED1 may divide an area of a cutout pattern CP that the second dam DAM2 surrounds.

In the first encapsulation divider ED1, the first inorganic layer 161 may be in contact with the common electrode 173', the first inorganic encapsulation layer 191 may be in contact with the common electrode 173', and the second inorganic encapsulation layer 193 may be in contact with the first inorganic encapsulation layer 191. In the second dam DAM2, the first inorganic encapsulation layer 191 may be in contact with the first inorganic layer 161, and the second inorganic encapsulation layer 193 may be in contact with the first inorganic encapsulation layer 191. A plurality of inorganic layers may be stacked in the first encapsulation divider ED1 and the second dam DAM2. Accordingly, the area defined by the first encapsulation divider ED1 and the second dam DAM2 can be encapsulated individually. For example, an individual encapsulation area IEA may be defined by the first encapsulation divider ED1 and the second dam DAM2. For example, each of the individual encapsulation areas IEA may be surrounded by the first encapsulation divider ED1 and the second dam DAM2.

The second pixel PX2 may be disposed in each of the individual encapsulation area IEA. For example, because each of the second pixels PX2 is surrounded by the first encapsulation divider ED1 and the second dam DAM2, they can be encapsulated individually. Therefore, even if one of the second pixels PX2 of the cutout pattern CP is displayed as a dark spot as moisture permeates due to particles, it is possible to prevent or reduce damage to the other second pixels PX2 of the cutout pattern CP. For example, even when one of the second pixels PX2 of the cutout pattern CP is displayed as a dark spot as moisture permeates due to particles, it is possible to prevent, or reduce the occurrence of, all of the second pixels PX2 of the cutout pattern CP from being seen as dark spots.

The power contact hole PCT may be disposed in the area surrounded by the second dam DAM2. The power contact hole PCT may be disposed in one of the individual encapsulation areas IEA. For example, the power contact hole PCT may be disposed between the second dam DAM2 and the second pixel PX2 disposed at one edge of the cutout pattern CP. The edge of the cutout pattern CP may be the edge of the cutout pattern CP adjacent to the non-display area NDA or the cutout connection pattern CBP. The power contact hole PCT may be a power connection hole at which (e.g., to which) the first voltage line VSL (see FIG. 13) and the common electrode 173' (see FIG. 13) are coupled (e.g., connected). Accordingly, the first supply voltage of the first voltage line VSL (see FIG. 13) may be applied to the common electrode 173' (see FIG. 13).

Figure 12:
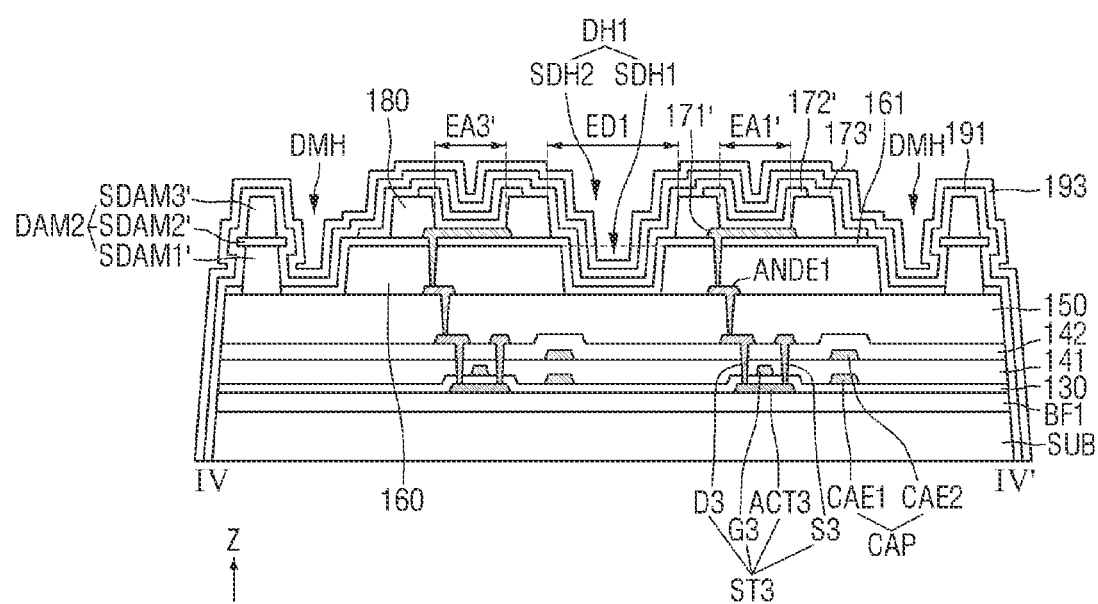
FIG. 12 is a cross-sectional view showing an example of a display panel, taken along line IV-IV' of FIG. 11.
Figure 13:
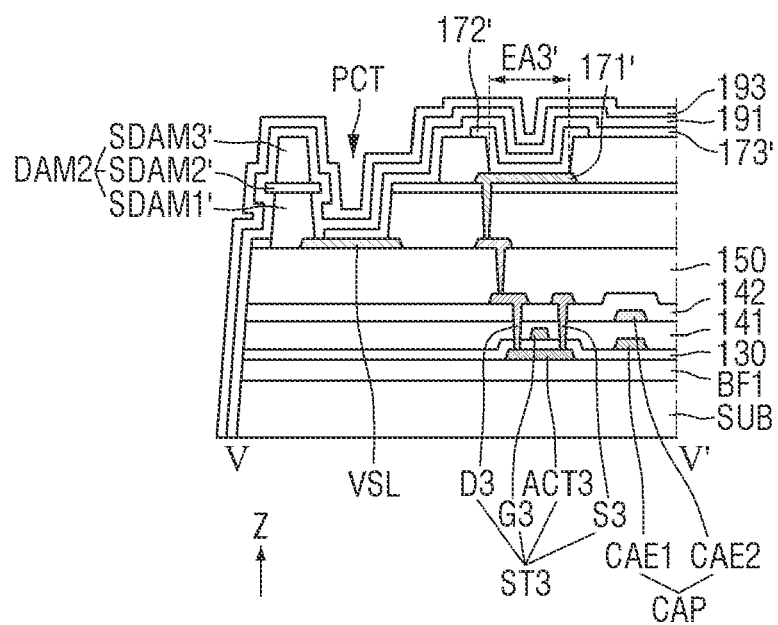
FIG. 13 is a cross-sectional view showing an example of the display panel taken along line V-V' of FIG. 11.

FIG. 12 is a cross-sectional view showing an example of a display panel, taken along line IV-IV' of FIG. 11. FIG. 13 is a cross-sectional view showing an example of the display panel taken along line V-V' of FIG. 11.

A third thin-film transistor ST3 of the thin-film transistor layer TFTL, a first emission area EA1' and a third emission area EA3' may be substantially identical to the first thin-film transistor ST1 of the thin-film transistor layer TFTL, the first emission area EA1, and the third emission area EA3, respectively, described above with reference to FIG. 8. Therefore, the redundant description may not be provided. Although the first emission area EA1' and the third emission area EA3' are shown in FIG. 12, the second emission area EA2' may be substantially identical to the first emission area EA1' and the third emission area EA3' shown in FIG. 12.

The second display area DA2 includes cutout patterns CP and cutting grooves CG formed by cutting the display panel 300 with a laser. The second organic encapsulation layer 192 of the encapsulation layer TFEL may be formed via an inkjet process. If the length or width of the cutout patterns CP in the D-direction DRD ranges in several tens of μm, it is difficult to form the second organic encapsulation layer 192 within the second dams DAM2 of the cutout patterns CP. If the second organic encapsulation layer 192 is formed in the cutting grooves CG, the cutout patterns CP are coupled (e.g., connected) by the second organic encapsulation layer 192. As a result, the strain and stress applied to the second display area DA2 due to the double curvature may not be reduced sufficiently. Therefore, the encapsulation layer TFEL in the first display area DA1 and the third display area DA3 includes the first inorganic encapsulation layer 191, the second organic encapsulation layer 192, and the second inorganic encapsulation layer 193, whereas the encapsulation layer TFEL in the second display area DA2 includes the first inorganic encapsulation layer 191 and the second inorganic encapsulation layer 193, but not the second organic encapsulation layer 192.

Because the second organic encapsulation layer 192 of the encapsulation layer TFEL is higher than the first inorganic encapsulation layer 191 and the second inorganic encapsulation layer 193, it works as a particle cover layer to cover particles. When the encapsulation layer TFEL does not include the second organic encapsulation layer 192 in the second display area DA2, a part of the first inorganic encapsulation layer 191 and the second inorganic encapsulation layer 193 may be broken by particles. As a result, moisture and/or oxygen may be introduced and thus the emissive layer 172' may be damaged. When this happens, all of the second pixels PX2 disposed on the cutout patterns CP may be displayed as dark spots.

The first encapsulation divider ED1 may include a first hole DH1. The first hole DH1 may be a hole penetrating the second planarization layer 160 and the bank 180. The first hole DH1 may include a first sub-hole SDH1 penetrating through the second planarization layer 160, and a second sub-hole SDH2 penetrating the bank 180. The size (e.g., planar area in the plan view) of the first sub-hole SDH1 may be larger than the size of the second sub-hole SDH2. For example, the length of the first sub-hole SDH1 in the C-direction DRC may be longer than the length of the second sub-hole SDH2 in the C-direction DRC.

Because the size of the first sub-hole SDH1 may be larger than the size of the second sub-hole SDH2, a part of the upper surface of the first inorganic layer 161 may not be covered by the bank 180. A part of the upper surface of the first inorganic layer 161 may be in contact with the common electrode 173'.

The second dam DAM2 may include a first sub-dam SDAM1' made of the same material as the second planarization layer 160, a second sub-dam SDAM2' made of the same material as the first inorganic layer 161, and a third sub-dam SDAM3' made of the same material as the bank 180. The second dam DAM2 may further include a fourth sub-dam disposed on the third sub-dam SDAM3'.

The second dam DAM2 may be formed into an undercut shape in a cross-sectional view. For example, the maximum length of the second sub-dam SDAM2' in a direction may be larger than the maximum length of the first sub-dam SDAM1' in the direction. For example, a portion of the second sub-dam SDAM2' may extend beyond an edge of the first sub-dam SDAM1' in the plan view such that the second sub-dam SDAM2' overhangs the first sub-dam SDAM1' in the plan view. Accordingly, even if the emissive layer 172' or the common electrode 173' is formed up to the second dam DAM2, it may be uncoupled (e.g., disconnected) due to the undercut shape of the second dam DAM2 in a cross-sectional view.

The first inorganic layer 161, the common electrode 173', the first inorganic encapsulation layer 191, and the second inorganic encapsulation layer 193 may be disposed in the first hole DH1. A dam hole DMH penetrating the second planarization layer 160 may be formed on the inner side of the second dam DAM2. The first inorganic layer 161, the first inorganic encapsulation layer 191 and the second inorganic encapsulation layer 193 may be disposed in the dam hole DMH. Accordingly, each of the second pixels PX2 may be surrounded by the first hole DH1 of the first encapsulation divider ED1 and the dam hole DMH of the second dam DAM2. Therefore, because the inorganic layers are in contact with each other in the first hole DH1 and the dam hole DMH of the second dam DAM2, each of the second pixels PX2 can be encapsulated individually. Therefore, even if one of the second pixels PX2 of the cutout pattern CP is displayed as a dark spot due to moisture permeation by particles, it is possible to prevent or reduce damage to the other second pixels PX2 of the cutout pattern CP. For example, even when one of the second pixels PX2 of the cutout pattern CP is displayed as a dark spot as moisture permeates due to particles, it is possible to prevent, or reduce the occurrence of, all of the second pixels PX2 of the cutout pattern CP from being seen as dark spots.

In addition, the first inorganic encapsulation layer 191 and the second inorganic encapsulation layer 193 may be disposed on the cut surfaces or side portions of the cutout pattern CP. For example, the first inorganic encapsulation layer 191 and the second inorganic encapsulation layer 193 may be disposed on the cut surfaces or side portions of the substrate SUB, the first buffer layer BF1, the gate insulator 130, the first interlayer dielectric layer 141, the second interlayer dielectric layer 142 and the first planarization layer 150 of the cutout pattern CP. Accordingly, it is possible to prevent or reduce damage to the emissive layer 172' which may occur when moisture and/or oxygen is introduced through the cut surfaces or side portions of the cutout pattern CP.

The power contact hole PCT penetrates the second planarization layer 160 to expose the first voltage line VSL. The common electrode 173' may be coupled (e.g., connected) to the first voltage line VSL through the power contact hole PCT.

Figure 14:
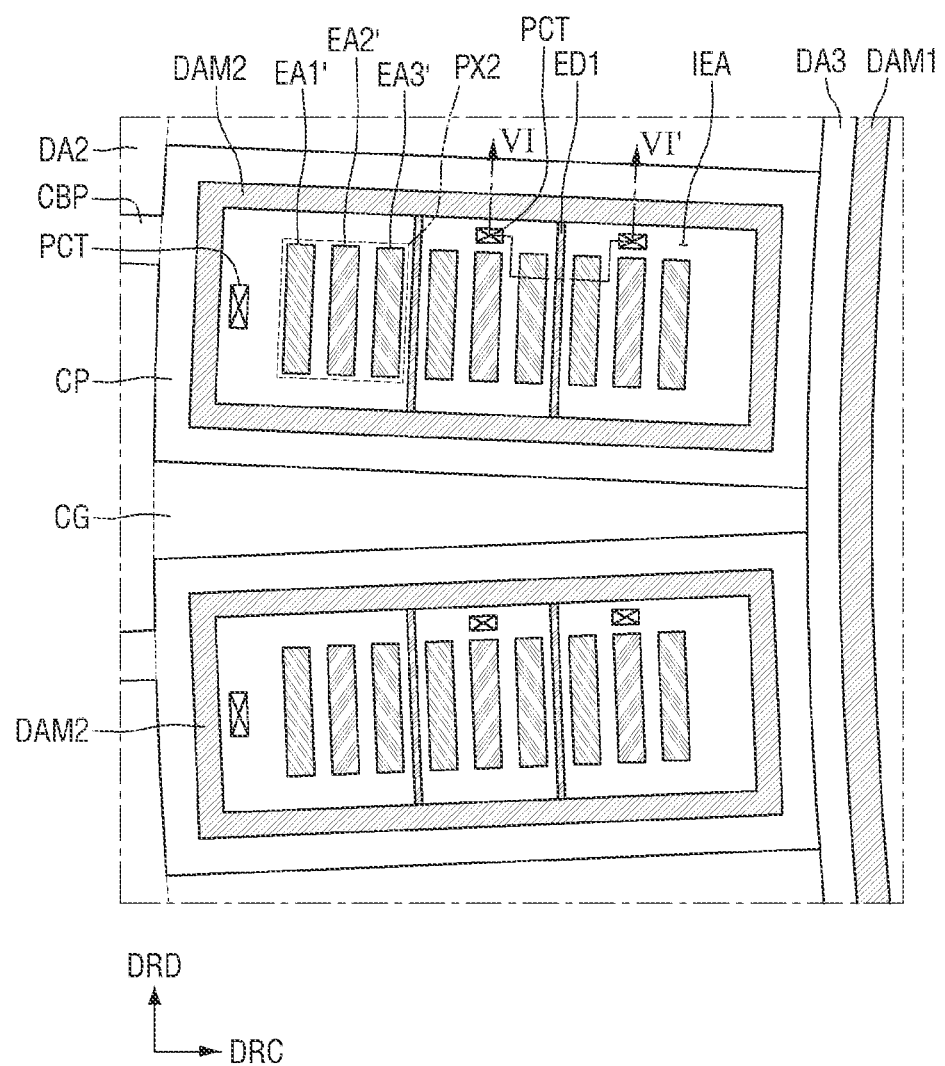
FIG. 14 is a layout diagram showing yet another example of the second display area of FIG. 5.
Figure 15:
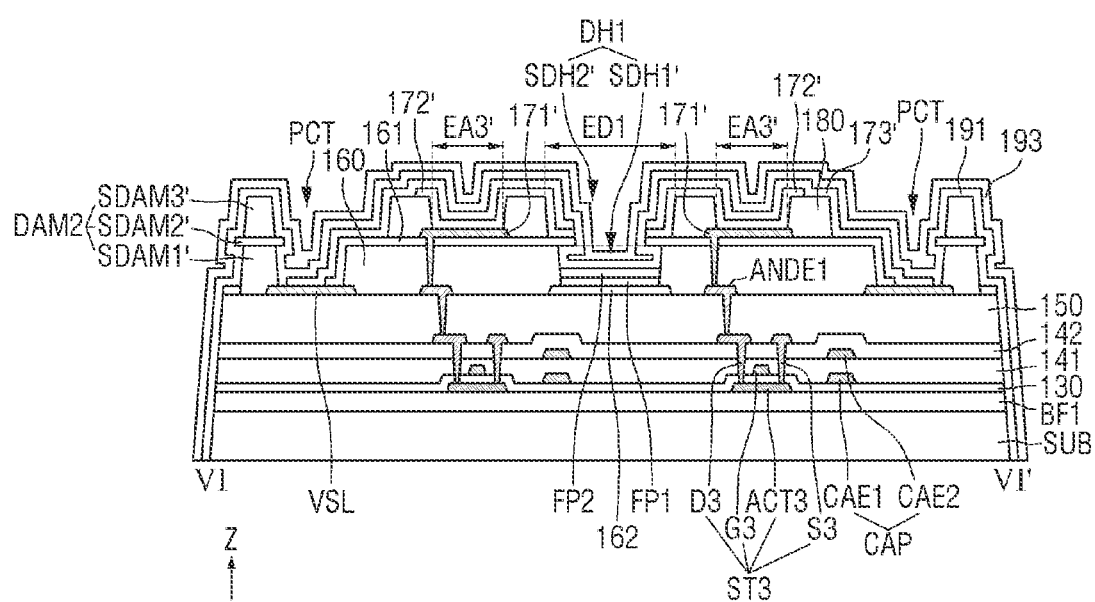
FIG. 15 is a cross-sectional view showing an example of the display panel taken along line VI-VI' of FIG. 14.

FIG. 14 is a layout diagram showing another example of the second display area of FIG. 5. FIG. 15 is a cross-sectional view showing an example of the display panel taken along line VI-VI' of FIG. 14.

The example embodiment of FIGS. 14 and 15 is different from the example embodiment of FIGS. 11 and 12 in that a first dividing hole DH1 of a first encapsulation divider ED1 has an under-cut profile, and that a power contact hole PCT is disposed in each of individual encapsulation areas IEA. The description will focus on the differences.

Referring to FIGS. 14 and 15, a first hole DH1' may include a first sub-hole SDH1' and a second sub-hole SDH2'.

The first sub-hole SDH1' may penetrate through the second planarization layer 160 to expose a second inorganic layer 162 disposed on the first planarization layer 150. The first sub-hole SDH1' may be formed into an undercut shape in a cross-sectional view. The undercut shape refers to a hole in which the inlet is smaller than the bottom or a hole in which the inlet is smaller than the area between the inlet and the bottom. A hole having the undercut shape in a cross-sectional view may resemble a pot or eaves of a roof in a cross-sectional view. For example, the inlet of the first sub-hole SDH1' may be defined by the first inorganic layer 161. The lower surface of the first inorganic layer 161 may not be covered by the second planarization layer 160. For this reason, the size of the inlet of the first sub-hole SDH1' may be smaller than the size of the area between the inlet and the bottom of the first sub-hole SDH1'. In some embodiments, a portion of the first inorganic layer 161 may extend beyond a side surface of the second planarization layer 160 forming the first sub-hole SDH1' in the plan view such that the first inorganic layer 161 overhangs the second planarization layer 160 in the plan view and a length of an opening in the first inorganic layer 161 that overlaps the first sub-hole SDH1' in the plan view is less than a length of the first sub-hole SDH1' at a lower surface of the first inorganic layer 161.

In the first sub-hole SDH1', the second inorganic layer 162, a first floating pattern FP1, a second floating pattern FP2, the first inorganic encapsulation layer 191 and the second inorganic encapsulation layer 193 may be disposed (e.g., sequentially stacked). Because the emissive layer 172' and the common electrode 173' have poor step coverage, they may not be disposed on the sidewalls of the first sub-hole SDH1'. Therefore, the emissive layer 172' and the common electrode 173' may be uncoupled (e.g., disconnected) at the first encapsulation divider ED1. The step coverage refers to the ability of subsequent layers to evenly cover levels ("steps") already present on the substrate without being uncoupled (e.g., disconnected).

The first floating pattern FP1 may be disposed on the second inorganic layer 162 of the first sub-hole SDH1. The first floating pattern FP1 may be a residual layer of the emissive layer 172' that is not coupled (e.g., connected) to the emissive layer 172' but is uncoupled (e.g., disconnected) from it. The first floating pattern FP1 may be made of the same material as the emissive layer 172'.

In addition, the second floating pattern FP2 may be disposed on the second inorganic layer 162 (e.g., above the first floating pattern FP1) of the first sub-hole SDH1. The second floating pattern FP2 may be a residual layer of the common electrode 173' that is not coupled (e.g., connected) to the common electrode 173' but is uncoupled (e.g., disconnected) from it. The second floating pattern FP2 may be made of the same material as the common electrode 173'.

Because the common electrode 173' is uncoupled (e.g., disconnected) at the first encapsulation divider ED1 by the undercut shape of the first hole DH1' in a cross-sectional view, the common electrode 173' of the individual encapsulation area IEA is uncoupled (e.g., disconnected) from the common electrode 173' of another individual encapsulation area IEA adjacent thereto, with the first encapsulation divider ED1 therebetween. Therefore, a power contact hole PCT for applying the first supply voltage to the common electrode 173' may be disposed in each of the individual encapsulation areas IEA.

The second sub-hole SDH2' may penetrate the bank 180. The first inorganic encapsulation layer 191 and the second inorganic encapsulation layer 193 may be disposed in the second sub-hole SDH2'.

Figure 16:
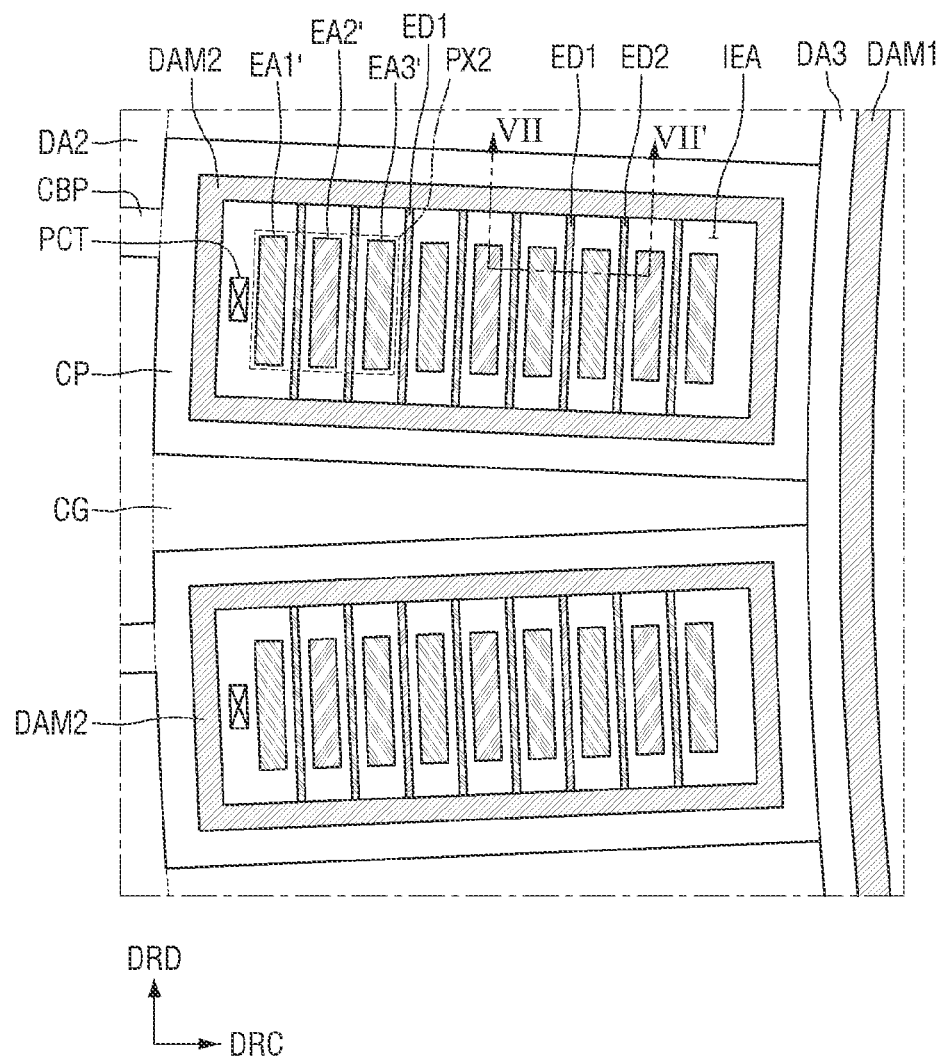
FIG. 16 is a layout diagram showing yet another example of the second display area of FIG. 5.
Figure 17:
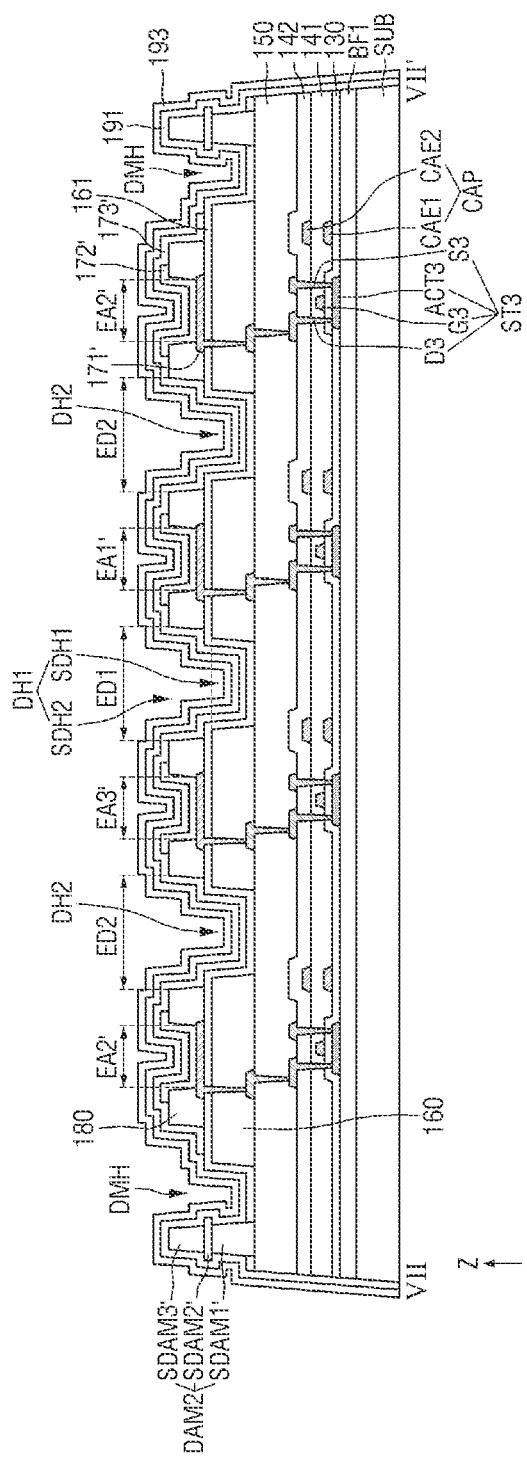
FIG. 17 is a cross-sectional view showing an example of a display panel taken along line VII-VII' of FIG. 16.

FIG. 16 is a layout diagram showing yet another example of the second display area of FIG. 5. FIG. 17 is a cross-sectional view showing an example of a display panel taken along line VII-VII' of FIG. 16.

The example embodiment of FIGS. 16 and 17 is different from the example embodiment of FIGS. 11 and 12 in that a second encapsulation divider ED2 is disposed between a first emission area EA1' and a second emission area EA2' and between the second emission area EA2' and a third emission area EA3' of each of the second pixels PX2. The description will focus on the difference.

The second encapsulation divider ED2 may be disposed between the first emission area EA1' and the second emission area EA2' and between the second emission area EA2' and the third emission area EA3' of each of the second pixels PX2. When the second encapsulation divider ED2 is disposed between adjacent emission areas EA1', EA2', and EA3' in the C-direction DRC, it may be extended (e.g., may extend) in the D-direction DRD. The second encapsulation divider ED2 may be coupled (e.g., connected) to the second dam DAM2. For example, the second encapsulation divider ED2 may extend from one part of the second dam DAM2 to another part of the second dam DAM2 to divide an area of the cutout pattern CP surrounded by the second dam DAM2.

The second encapsulation divider ED2 may include a second hole DH2. The second hole DH2 may penetrate the second planarization layer 160 and the bank 180. The second hole DH2 may be substantially identical to the first hole DH1 of the first encapsulation divider ED1 shown in FIG. 12. Therefore, the redundant description may not be provided.

In the first encapsulation divider ED1 and the second encapsulation divider ED2, the first inorganic layer 161 may be in contact with the common electrode 173', the first inorganic encapsulation layer 191 may be in contact with the common electrode 173', and the second inorganic encapsulation layer 193 may be in contact with the first inorganic encapsulation layer 191. In the second dam DAM2, the first inorganic encapsulation layer 191 may be in contact with the first inorganic layer 161, and the second inorganic encapsulation layer 193 may be in contact with the first inorganic encapsulation layer 191. In some embodiments, in the dam hole DMH, the first inorganic encapsulation layer 191 may be in contact with the first inorganic layer 161, and the second inorganic encapsulation layer 193 may be in contact with the first inorganic encapsulation layer 191. A plurality of inorganic layers may be stacked in the first encapsulation divider ED1, the second encapsulation divider ED2 and the second dam DAM2. In some embodiments, a plurality of inorganic layers may be stacked in the dam hole DMH. Accordingly, the area defined by the first encapsulation divider ED1, the second encapsulation divider ED2, and the second dam DAM2 can be individually encapsulated. For example, each of the individual encapsulation areas IEA may be defined by the first encapsulation divider ED1, the second encapsulation divider ED2 and the second dam DAM2. For example, each of the individual encapsulation areas IEA may be defined by the first encapsulation divider ED1, the second encapsulation divider ED2, and the second dam DAM2.

The emission areas EA1', EA2', and EA3' of the second pixel PX2 may be disposed in the individual encapsulation areas IEA, respectively. For example, each of the emission areas EA1', EA2', and EA3' of the second pixels PX2 is surrounded by the first encapsulation divider ED1, the second encapsulation divider ED2, and/or the second dam DAM2, and thus they can be encapsulated individually. In some embodiments, each of the emission areas EA1', EA2', and EA3' of a second pixel PX2 may be surrounded by the second dam DAM2 and one or both of the first encapsulation divider ED1 and the second encapsulation divider ED2. Therefore, even if one of the emission areas of the second pixels PX2 of the cutout pattern CP is displayed as a dark spot as moisture permeates due to particles, it is possible to prevent or reduce damage to the other emission areas of the second pixels PX2 of the cutout pattern CP. Therefore, even if one of the emission areas of the second pixels PX2 of the cutout pattern CP is displayed as a dark spot as moisture permeates due to particles, it is possible to prevent, or reduce the occurrence of, all of the emission areas EA1', EA2', and EA3' of the second pixels PX2 of the cutout pattern CP from being displayed as dark spots.

Figure 18:
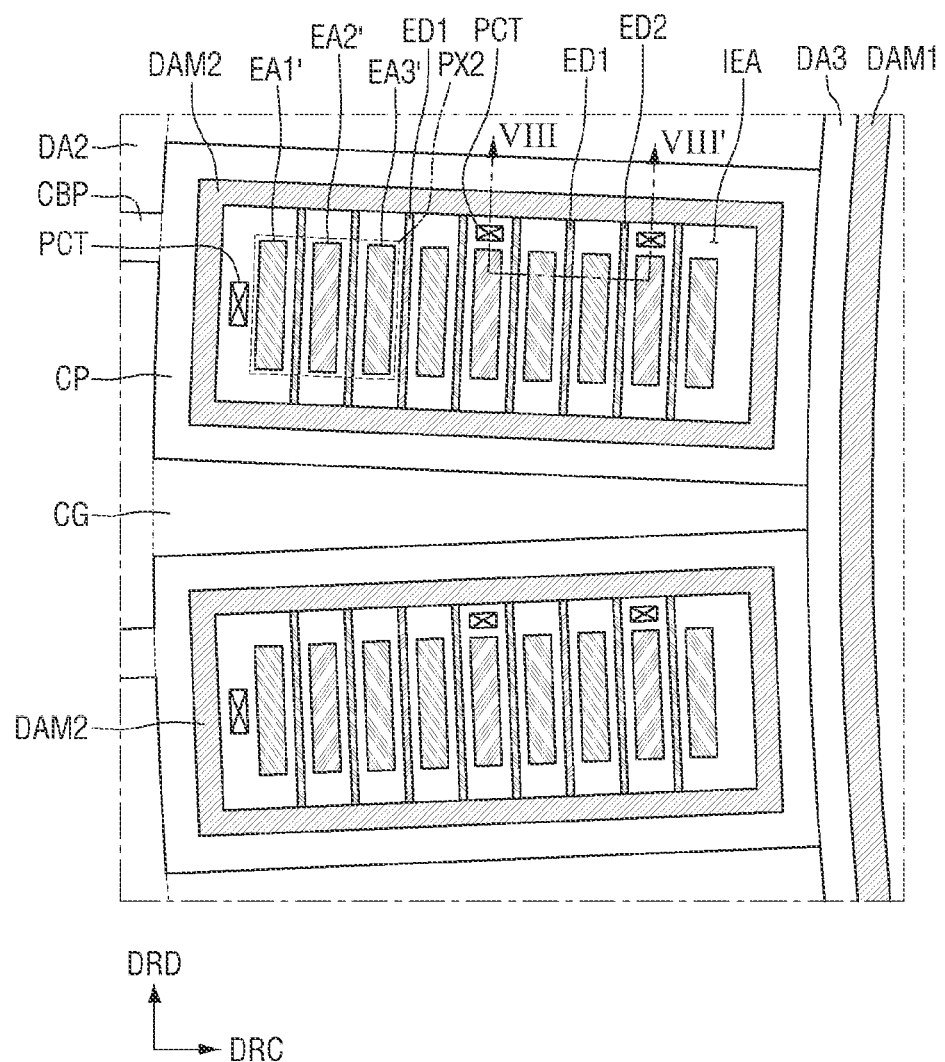
FIG. 18 is a layout diagram showing yet another example of the second display area of FIG. 5.
Figure 19:
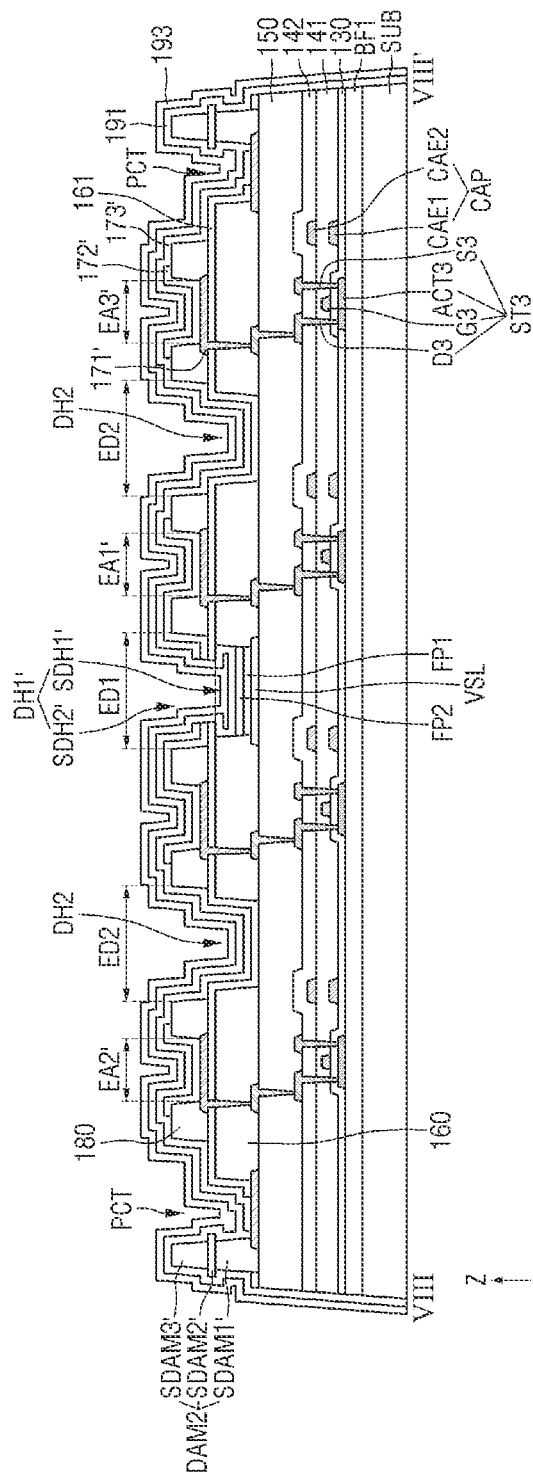
FIG. 19 is a cross-sectional view showing an example of the display panel taken along line VIII-VIII' of FIG. 18.

FIG. 18 is a layout diagram showing yet another example of the second display area of FIG. 5. FIG. 19 is a cross-sectional view showing an example of the display panel taken along line VIII-VIII' of FIG. 18.

The example embodiment of FIGS. 18 and 19 is different from the example embodiment of FIGS. 16 and 12 in that a first hole DH1' of a first encapsulation divider ED1 has an under-cut profile, and that a power contact hole is disposed in each of individual encapsulation areas IEA.

The undercut shape in a cross-sectional view of the first hole DH1' and the power contact hole PCT in each of the individual encapsulation areas IEA according to the example embodiment of FIGS. 18 and 19 are substantially identical to those described above with reference to FIGS. 14 and 15. Therefore, the redundant description may not be provided.

Figure 20:
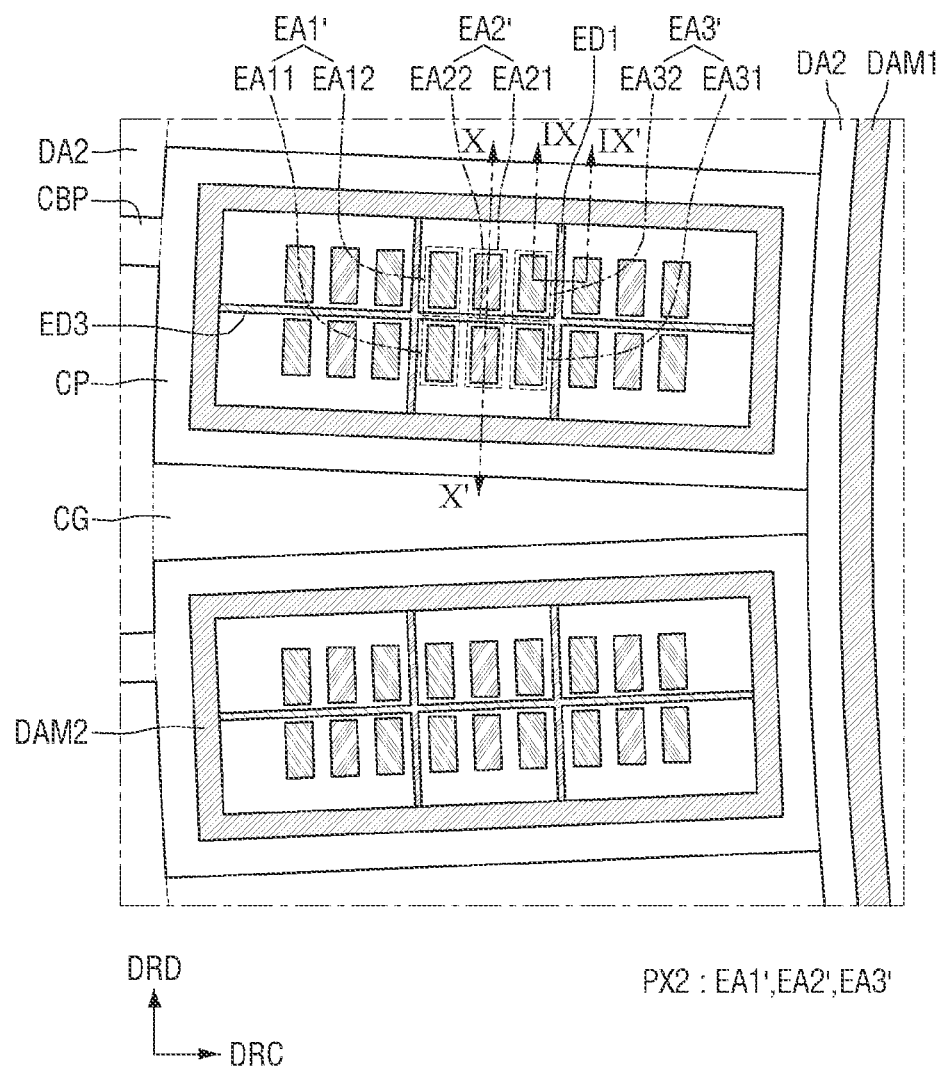
FIG. 20 is a layout diagram showing yet another example of the second display area of FIG. 5.
Figure 21:
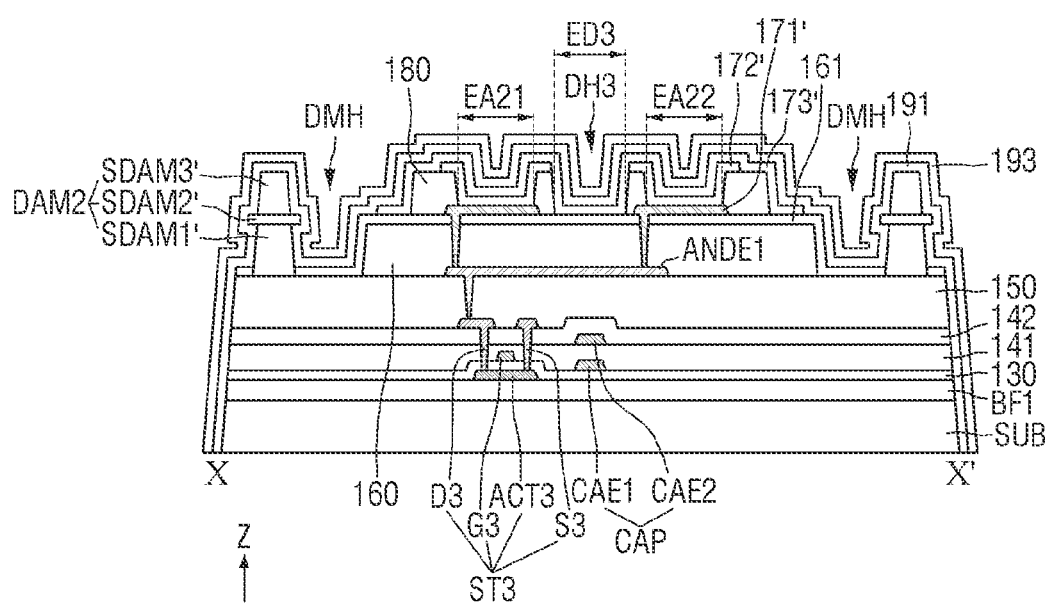
FIG. 21 is a cross-sectional view showing an example of the display panel taken along line X-X' of FIG. 20.

FIG. 20 is a layout diagram showing yet another example of the second display area of FIG. 5. FIG. 21 is a cross-sectional view showing an example of the display panel taken along line X-X' of FIG. 20.

The example embodiment of FIGS. 20 and 21 is different from the example embodiment of FIGS. 11 and 12 in that a first emission area EA1' includes a first sub-emission area EA11 and a second sub-emission area EA12, a second emission area EA2' includes a third sub-emission area EA21 and a fourth sub-emission area EA22, a third emission area EA3' includes a fifth sub-emission area EA31 and a sixth sub-emission area EA32, and a third encapsulation divider ED3 is further disposed. The description will focus on the differences. The cross section of the display panel of FIG. 20, taken along line IX-IX' is substantially identical to that of FIG. 12. Therefore, the redundant description may not be provided.

Referring to FIGS. 20 and 21, a pixel electrode 171' of a first sub-emission area EA11 and a pixel electrode 171' of a second sub-emission area EA12 may be coupled (e.g., connected) to the same first connection electrode ANDE1. Therefore, the pixel electrode 171' of the first sub-emission area EA11 and the pixel electrode 171' of the second sub-emission area EA12 may be electrically coupled (e.g., connected) to a third source electrode S3 or a third drain electrode D3 of the same third thin-film transistor ST3. Therefore, the same voltage may be applied to the pixel electrode 171' of the first sub-emission area EA11 and the pixel electrode 171' of the second sub-emission area EA12. Therefore, the first sub-emission area EA11 and the second sub-emission area EA12 of the first emission area EA1' may emit the same light with the same brightness. For example, the first sub-emission area EA11 and the second sub-emission area EA12 may emit red light having the same brightness.

The pixel electrode 171' of the third sub-emission area EA21 and the pixel electrode 171' of the fourth sub-emission area EA22 may be coupled (e.g., connected) to the same first connection electrode ANDE1. Therefore, the pixel electrode 171' of the third sub-emission area EA21 and the pixel electrode 171' of the fourth sub-emission area EA22 may be electrically coupled (e.g., connected) to the third source electrode S3 or the third drain electrode D3 of the same third thin-film transistor ST3. Therefore, the same voltage may be applied to the pixel electrode 171' of the third sub-emission area EA21 and the pixel electrode 171' of the fourth sub-emission area EA22. Therefore, the third sub-emission area EA21 and the fourth sub-emission area EA22 of the second emission area EA2' may emit the same light with the same brightness. For example, the third sub-emission area EA21 and the fourth sub-emission area EA22 may emit green light having the same brightness.

The pixel electrode 171' of the fifth sub-emission area EA31 and the pixel electrode 171' of the sixth sub-emission area EA32 may be coupled (e.g., connected) to the same first connection electrode ANDE1. Therefore, the pixel electrode 171' of the fifth sub-emission area EA31 and the pixel electrode 171' of the sixth sub-emission area EA32 may be electrically coupled (e.g., connected) to the third source electrode S3 or the third drain electrode D3 of the same third thin-film transistor ST3. Therefore, the same voltage may be applied to the pixel electrode 171' of the fifth sub-emission area EA31 and the pixel electrode 171' of the sixth sub-emission area EA32. Therefore, the fifth sub-emission area EA31 and the sixth sub-emission area EA32 of the third emission area EA3' may emit the same light with the same brightness. For example, the fifth sub-emission area EA31 and the sixth sub-emission area EA32 may emit blue light having the same brightness.

Although each of the first sub-emission area EA11, the second sub-emission area EA12, the third sub-emission area EA21, the fourth sub-emission area EA22, the fifth sub-emission area EA31 and the sixth sub-emission area EA32 has a rectangular shape having shorter sides in the C-direction DRC and longer sides in the D-direction DRD when viewed from the top (e.g., from the plan view) in the example shown in FIG. 20, the present disclosure is not limited thereto. Each of the first sub-emission area EA11, the second sub-emission area EA12, the third sub-emission area EA21, the fourth sub-emission area EA22, the fifth sub-emission area EA31, and the sixth sub-emission area EA32 may have a suitable polygonal shape other than a quadrangular shape, a circular shape, or an elliptical shape when viewed from the top (e.g., from the plan view). In addition, although the first sub-emission area EA11, the second sub-emission area EA12, the third sub-emission area EA21, the fourth sub-emission area EA22, the fifth sub-emission area EA31, and the sixth sub-emission area EA32 has substantially the same area (e.g., planar area when viewed from the plan view) in the example shown in FIG. 20, the present disclosure is not limited thereto. At least one selected from among the first sub-emission area EA11, the second sub-emission area EA12, the third sub-emission area EA21, the fourth sub-emission area EA22, the fifth sub-emission area EA31, and the sixth sub-emission area EA32 may have a different area from the others.

The first sub-emission area EA11 and the second sub-emission area EA12 may be spaced apart from each other in the D-direction DRD. The third sub-emission area EA21 and the fourth sub-emission area EA22 may be spaced apart from each other in the D-direction DRD. The fifth sub-emission area EA31 and the sixth sub-emission area EA32 may be spaced apart from each other in the D-direction DRD.

The third encapsulation divider ED3 may be disposed between the first sub-emission area EA11 and the second sub-emission area EA12, between the third sub-emission area EA21 and the fourth sub-emission area EA22, and between the fifth sub-emission area EA31 and the sixth sub-emission area EA32. The third encapsulation divider ED3 may be extended (e.g., may extend) in the C-direction DRC. The third encapsulation divider ED3 may be coupled (e.g., connected) to the second dam DAM2. For example, one end of the third encapsulation divider ED3 may be coupled (e.g., connected) to one part of the second dam DAM2, and another end of the third encapsulation divider ED3 may be coupled to another part of the second dam DAM2 to divide an area of the cutout pattern CP surrounded by the second dam DAM2.

The third encapsulation divider ED3 may include a third hole DH3. The third hole DH3 may penetrate the bank 180 to expose the first inorganic layer 161. The third hole DH3 may be located between the pixel electrode 171' of the first sub-emission area EA11 and the pixel electrode 171' of the second sub-emission area EA12. The third hole DH3 may be located between the pixel electrode 171' of the third sub-emission area EA21 and the pixel electrode 171' of the fourth sub-emission area EA22. The third hole DH3 may be located between the pixel electrode 171' of the fifth sub-emission area EA31 and the pixel electrode 171' of the sixth sub-emission area EA32.

The common electrode 173', the first inorganic encapsulation layer 191, and the second inorganic encapsulation layer 193 may be disposed in the third hole DH3. Accordingly, in the third encapsulation divider ED3, the first inorganic layer 161 may be in contact with the common electrode 173', the first inorganic encapsulation layer 191 may be in contact with the common electrode 173', and the second inorganic encapsulation layer 193 may be in contact with the first inorganic encapsulation layer 191. Therefore, the movement of moisture and/or oxygen can be blocked by the third encapsulation divider ED3. Accordingly, the area defined by the first encapsulation divider ED1, the third encapsulation divider ED3 and the second dam DAM2 can be individually encapsulated. For example, the first sub-emission area EA11, the third sub-emission area EA21, and the fifth sub-emission area EA31 can be individually encapsulated, and the second sub-emission area EA12, the fourth sub-emission area EA22 and the sixth sub-emission area EA32 can be individually encapsulated. For example, the third encapsulation divider ED3 may be surrounded by the first encapsulation divider ED1, the third encapsulation divider ED3, and the second dam DAM2.

Therefore, even if one of the first sub-emission area EA11, the third sub-emission area EA21, and the fifth sub-emission area EA31 is displayed as a dark spot as moisture permeates due to particles, it is possible to prevent, or reduce the occurrence of, the second sub-emission area EA12, the fourth sub-emission area EA22, and the sixth sub-emission area EA32 from being damaged and accordingly displayed as dark spots. In addition, even if one of the second sub-emission area EA12, the fourth sub-emission area EA22, and the sixth sub-emission area EA32 is displayed as a dark spot as moisture permeates due to particles, it is possible to prevent, or reduce the occurrence of, the first sub-emission area EA11, the third sub-emission area EA21, and the fifth sub-emission area EA31 from being damaged and accordingly displayed as dark spots.

For example, even if one of the first sub-emission area EA11 and the second sub-emission area EA12 of the first emission area EA1' for emitting the same light with the same brightness is displayed as a dark spot as moisture permeates due to particles, the other one may not be displayed as a dark spot. In addition, even if one of the third sub-emission area EA21 and the fourth sub-emission area EA22 of the second emission area EA2' for emitting the same light with the same brightness is displayed as a dark spot as moisture permeates due to particles, the other one may not be displayed as a dark spot. Moreover, even if one of the fifth sub-emission area EA31 and the sixth sub-emission area EA32 of the third emission area EA3' for emitting the same light with the same brightness is displayed as a dark spot as moisture permeates due to particles, the other one may not be displayed as a dark spot. Accordingly, even if some of the sub-emission areas EA11, EA12, EA21, EA22, EA31 and EA32 of the second pixel PX2, e.g., the first sub-emission area EA11, the third sub-emission area EA21, and the fifth sub-emission area EA31, are displayed as dark spots as moisture permeates due to particles, it is possible to display normally images by utilizing (e.g., using) the other sub-emission areas, e.g., the second sub-emission area EA12, the fourth sub-emission area EA22, and the sixth sub-emission area EA32.

Figure 22:
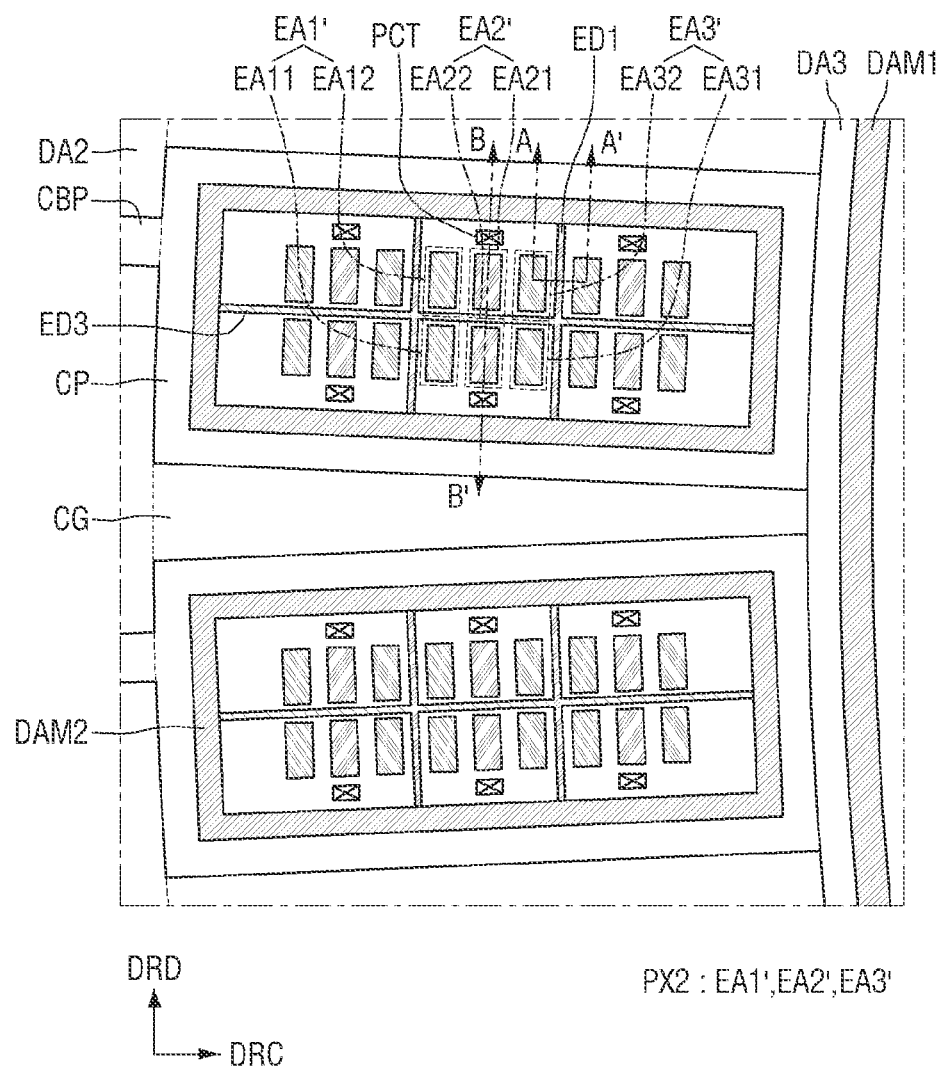
FIG. 22 is a layout diagram showing yet another example of the second display area of FIG. 5.
Figure 23:
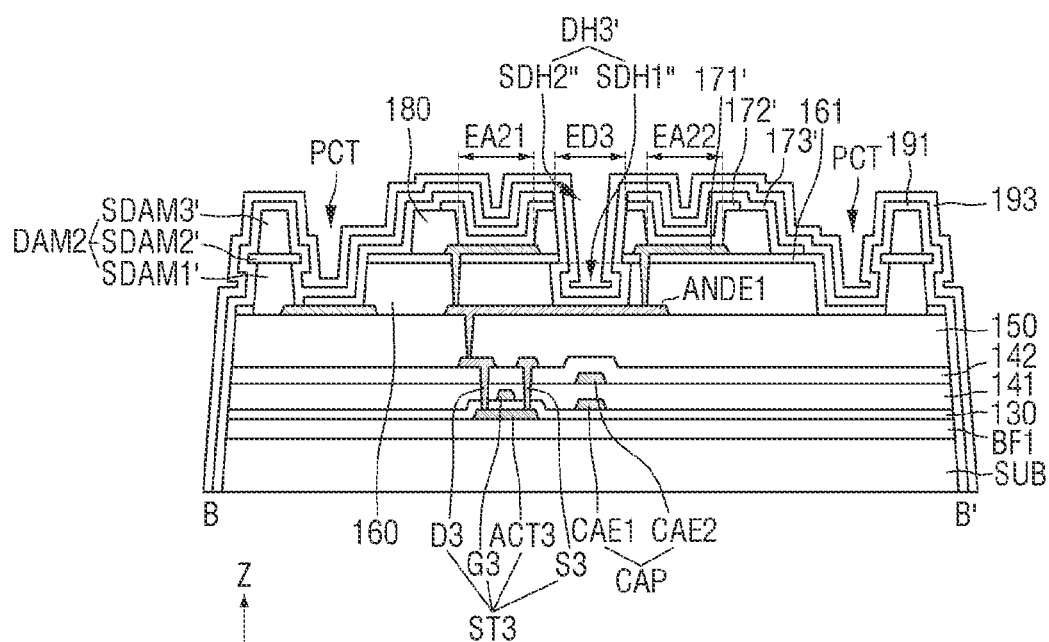
FIG. 23 is a cross-sectional view showing an example of the display panel taken along line B-B' of FIG. 22.

FIG. 22 is a layout diagram showing yet another example of the second display area of FIG. 5. FIG. 23 is a cross-sectional view showing an example of the display panel taken along line B-B' of FIG. 22.

The example embodiment of FIGS. 22 and 23 is different from the example embodiment of FIGS. 20 and 12 in that a third hole DH3' of a third encapsulation divider ED3 has an under-cut profile, and that a power contact hole is disposed in each of individual encapsulation areas IEA.

The power contact hole PCT in each of the individual encapsulation areas IEA according to the example embodiment of FIGS. 22 and 23 is substantially identical to that described above with reference to FIGS. 14 and 15. Therefore, the redundant description may not be provided. The cross section of the display panel of FIG. 22, taken along line A-A' is substantially identical to that of FIG. 12. Therefore, the redundant description may not be provided.

Referring to FIGS. 22 and 23, the third encapsulation divider ED3 may include a third hole DH3'. The third hole DH3' may penetrate the second planarization layer 160, the first inorganic layer 161 and the bank 180. The third hole DH3' may be located between the pixel electrode 171' of the first sub-emission area EA11 and the pixel electrode 171' of the second sub-emission area EA12. The third hole DH3' may be located between the pixel electrode 171' of the third sub-emission area EA21 and the pixel electrode 171' of the fourth sub-emission area EA22. The third hole DH3' may be located between the pixel electrode 171' of the fifth sub-emission area EA31 and the pixel electrode 171' of the sixth sub-emission area EA32.

The third hole DH3' may include a first sub-hole SDH1" and a second sub-hole SDH2".

The first sub-hole SDH1" may penetrate through the second planarization layer 160 to expose the first connection electrode ANDE1. The first sub-hole SDH1" may be formed into an undercut shape in a cross-sectional view. The undercut shape refers to a hole in which the inlet is smaller than the bottom or a hole in which the inlet is smaller than the area between the inlet and the bottom. A hole having the undercut shape in a cross-sectional view may resemble a pot or eaves of a roof in a cross-sectional view. For example, the inlet of the first sub-hole SDH1" may be defined by the first inorganic layer 161. The lower surface of the first inorganic layer 161 may not be covered by the second planarization layer 160. For this reason, the size of the inlet of the first sub-hole SDH1" may be smaller than the size of the area between the inlet and the bottom of the first sub-hole SDH1".

The first connection electrode ANDE1, the first inorganic encapsulation layer 191 and the second inorganic encapsulation layer 193 may be disposed in the first sub-hole SDH1". Because the emissive layer 172' and the common electrode 173' have poor step coverage, they may not be disposed on the sidewalls of the first sub-hole SDH1". As a result, the emissive layer 172' and the common electrode 173' may be uncoupled (e.g., disconnected) at the third encapsulation divider ED3. The step coverage refers to the ability of subsequent layers to evenly cover levels ("steps") already present on the substrate without being uncoupled (e.g., disconnected).

The second sub-hole SDH2" may penetrate the bank 180. The first inorganic encapsulation layer 191 and the second inorganic encapsulation layer 193 may be disposed in the second sub-hole SDH2".

Although no floating pattern is disposed in the first sub-hole SDH1" in the example shown in FIG. 23, the first floating pattern FP1 and the second floating pattern FP2 may be disposed in the first sub-hole SDH1" as shown in FIG. 15.

As shown in FIG. 23, the first connection electrode ANDE1 may be in contact with the first inorganic encapsulation layer 191, and the second inorganic encapsulation layer 193 may be in contact with the first inorganic encapsulation layer 191. Therefore, the movement of moisture and/or oxygen can be blocked by the third encapsulation divider ED3. Accordingly, the area defined by the first encapsulation divider ED1, the third encapsulation divider ED3, and the second dam DAM2 can be individually encapsulated.

Incidentally, because the common electrode 173' is uncoupled (e.g., disconnected) at the third encapsulation divider ED3 by the undercut shape in a cross-sectional view of the third hole DH3', the common electrode 173' of the individual encapsulation area IEA is uncoupled (e.g., disconnected) from the common electrode 173' of another individual encapsulation area IEA adjacent thereto, with the third encapsulation divider ED3 therebetween. Therefore, a power contact hole PCT for applying the first supply voltage to the common electrode 173' may be disposed in each of the individual encapsulation areas IEA.

Figure 24:
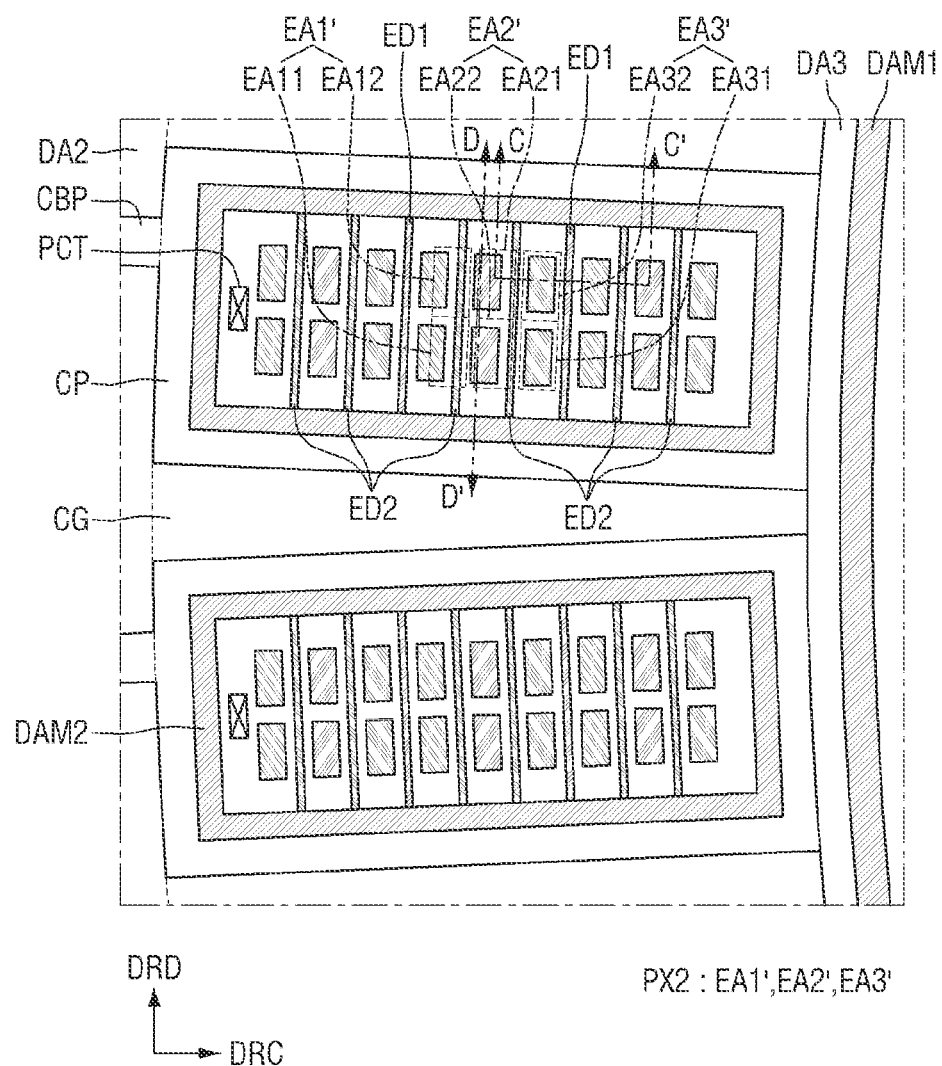
FIG. 24 is a layout diagram showing yet another example of the second display area of FIG. 5.

FIG. 24 is a layout diagram showing another example of the second display area of FIG. 5.

The example embodiment of FIG. 24 is different from the example embodiment of FIGS. 20 and 21 in that a second encapsulation divider ED2 is disposed between the first emission area EA1' and the second emission area EA2' and between the second emission area EA2' and the third emission area EA3' of each of the second pixels PX2.

The second encapsulation divider ED2 is substantially identical to that described above with reference to FIGS. 16 and 17. Therefore, the redundant description may not be provided. The cross section of the display panel of FIG. 24, taken along line C-C' is substantially identical to that of FIG. 12. Therefore, the redundant description may not be provided. The cross section of the display panel of FIG. 24, taken along line D-D' is substantially identical to that of FIG. 21. Therefore, the redundant description may not be provided.

Figure 25:
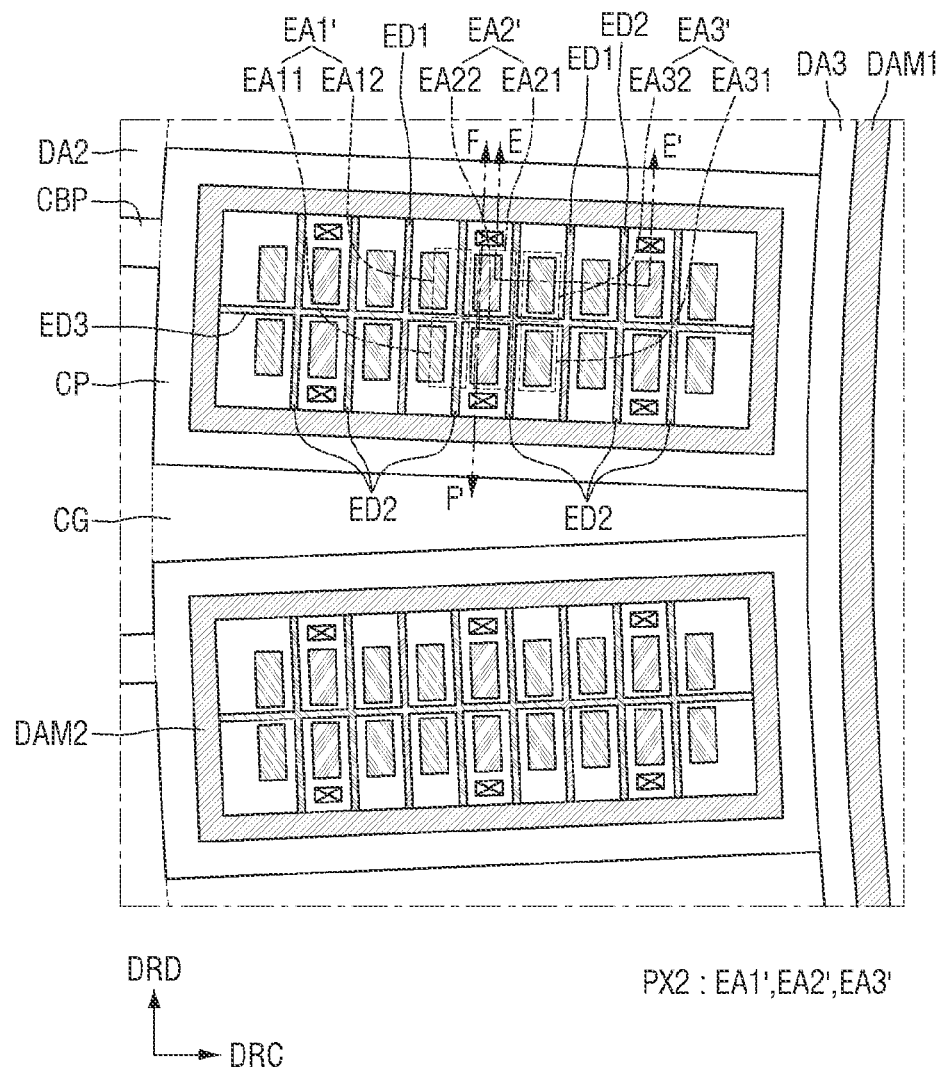
FIG. 25 is a layout diagram showing yet another example of the second display area of FIG. 5.

FIG. 25 is a layout diagram showing another example of the second display area of FIG. 5.

The example embodiment of FIG. 25 is different from the example embodiment of FIGS. 22 and 23 in that a second encapsulation divider ED2 is disposed between the first emission area EA1' and the second emission area EA2' and between the second emission area EA2' and the third emission area EA3' of each of the second pixels PX2.

The second encapsulation divider ED2 is substantially identical to that described above with reference to FIGS. 16 and 17. Therefore, the redundant description may not be provided. The cross section of the display panel of FIG. 25, taken along line E-E' is substantially identical to that of FIG. 12. Therefore, the redundant description may not be provided. The cross section of the display panel of FIG. 25, taken along line F-F' is substantially identical to that of FIG. 23. Therefore, the redundant description may not be provided.

Although some embodiments of the present disclosure have been disclosed for illustrative purposes, those of ordinary skill in the art will appreciate that various suitable modifications, additions, and substitutions are possible, without departing from the scope and spirit of the disclosure as defined by the accompanying claims and equivalents thereof.

What is claimed is:

1. A display device comprising:
a plurality of pixels, each of the plurality of pixels including a plurality of emission areas;
a dam around the plurality of pixels; and
a first divider between adjacent two pixels among the plurality of pixels,
wherein a plurality of light-emitting elements of a first pixel of the adjacent two pixels is surrounded by the dam and the first divider,
wherein a plurality of light-emitting elements of a second pixel of the adjacent two pixels is surrounded by the dam and the first divider, and
wherein the dam and the first divider are not between adjacent emission areas among the plurality of emission areas.

2. The display device of claim 1, wherein:
the first divider extends in one direction;
a first end of the first divider is in contact with a portion of the dam; and
a second end of the first divider is in contact with another portion of the dam.

3. The display device of claim 1, wherein each of the adjacent two pixels is surrounded by the dam and the first divider.

4. The display device of claim 1, wherein each of the plurality of emission areas is surrounded by the dam and the first divider.

5. The display device of claim 4, wherein a plurality of areas are defined by the dam and the first divider, and
the first pixel of the adjacent two pixels is in a first area among the plurality of areas, and
wherein a second pixel of the adjacent two pixels is in a second area among the plurality of areas.

6. The display device of claim 5, further comprising:
a power contact hole for coupling a first voltage line and a common electrode of a plurality of light-emitting elements of at least the first pixel, the power contact hole being located in the first area.

7. The display device of claim 5, further comprising:
a plurality of power contact holes, each of the plurality of power contact holes for coupling a first voltage line and a common electrode of a plurality of light-emitting elements of at least one pixel of the plurality of pixels, and
wherein a first power contact hole is in the first area, and wherein a second power contact hole is in the second area.

8. The display device of claim 1, further comprising:
a second divider between the first pixel of the adjacent two pixels and a second pixel among the plurality of pixels.

9. The display device of claim 8, wherein the first divider extends in a first direction, and
wherein the second divider extends in a second direction crossing the first direction.

10. A display device comprising:
a plurality of pixels, each of the plurality of pixels including a plurality of emission areas;
a dam around the plurality of pixels; and
a plurality of first dividers, each of the plurality of first dividers between adjacent two emission areas among the plurality of emission areas, wherein a light-emitting element of a first emission area of the adjacent two emission areas is surrounded by the dam and the first divider, wherein a light-emitting element of a second emission area of the adjacent two emission areas is surrounded by the dam and the first divider, wherein the display device further comprises:

a substrate;

a planarization layer on the substrate;

an inorganic layer above the planarization layer;

a light-emitting element comprising a pixel electrode, an emissive layer, and a common electrode and located above the inorganic layer in each of the plurality of emission areas; and a first inorganic layer above the light-emitting element, and wherein each of the plurality of first dividers comprises a first hole penetrating the planarization layer, wherein the inorganic layer is in the first hole and the first inorganic layer is on the inorganic layer in the first hole.

11. The display device of claim 10, wherein each of the adjacent two emission areas is surrounded by the dam and the first divider.

12. A display device comprising:

a substrate;

a thin film transistor on the substrate;

a planarization layer on the thin film transistor;

an inorganic layer above the planarization layer;

a light-emitting element comprising a pixel electrode, an emissive layer, and a common electrode and located above the inorganic layer;

a first inorganic layer above the light-emitting element; and a first divider including a first hole penetrating the planarization layer, wherein the inorganic layer is in the first hole and the first inorganic layer is on the inorganic layer in the first hole.

13. The display device of claim 12, further comprising:

a dam hole penetrating the planarization layer, wherein the inorganic layer is in contact with the first inorganic layer in the dam hole.

14. The display device of claim 13, wherein the light-emitting element is encapsulated by the inorganic layer and the first inorganic layer in the first hole and the dam hole.

15. The display device of claim 12, further comprising:

a power contact hole penetrating the planarization layer; and a first voltage line in the power contact hole, wherein the common electrode is in contact with the first voltage line in the power contact hole.

16. The display device of claim 12, wherein the inorganic layer is in contact with the first inorganic layer in the first hole.

17. The display device of claim 12, further comprising:

a first pattern between the inorganic layer and the first inorganic layer, wherein the first pattern comprises a same material as the emissive layer.

18. The display device of claim 17, further comprising:

a second pattern between the first pattern and the first inorganic layer, wherein the second pattern comprises a same material as the common electrode.

19. A display device comprising:

a substrate;

a thin film transistor on the substrate;

a planarization layer above the thin film transistor;

an inorganic layer above the planarization layer;

a light-emitting element comprising a pixel electrode, an emissive layer, and a common electrode and located above the inorganic layer;

a bank on a portion of the pixel electrode;

a first inorganic layer on the common electrode; and a first divider including a first hole penetrating the bank, wherein the inorganic layer is in the first hole, and the first inorganic layer is on the inorganic layer in the first hole.

20. The display device of claim 19, further comprising:

a dam hole penetrating the planarization layer, wherein the inorganic layer is in contact with the first inorganic layer in the dam hole, and wherein the light-emitting element is encapsulated by the inorganic layer and the first inorganic layer in the first hole and the dam hole.

* * * * *